US008284957B2

(12) United States Patent
Ong

(10) Patent No.: US 8,284,957 B2
(45) Date of Patent: Oct. 9, 2012

(54) METHOD AND APPARATUS FOR STEREO ENHANCEMENT OF AN AUDIO SYSTEM

(75) Inventor: Kok Huan Ong, Singapore (SG)

(73) Assignee: Creative Technology Ltd, Singapore (SG)

( * ) Notice: Subject to any disclaimer, the term of this patent is extended or adjusted under 35 U.S.C. 154(b) by 270 days.

(21) Appl. No.: 12/834,802

(22) Filed: Jul. 12, 2010

(65) Prior Publication Data

US 2012/0008798 A1    Jan. 12, 2012

(51) Int. Cl.
     *H03G 5/00*          (2006.01)
(52) U.S. Cl. ................. 381/98; 381/1; 381/103; 700/94
(58) Field of Classification Search ............... 381/98, 381/1, 103, 17, 28, 61; 700/94
See application file for complete search history.

(56) References Cited

U.S. PATENT DOCUMENTS

| 5,892,830 | A | 4/1999 | Klayman |
| 2008/0175409 | A1* | 7/2008 | Lee et al. .................... 381/98 |
| 2010/0086148 | A1* | 4/2010 | Hung et al. ................. 381/98 |

* cited by examiner

*Primary Examiner* — Vivian Chin
*Assistant Examiner* — Paul Kim
(74) *Attorney, Agent, or Firm* — Creative Technology Ltd

(57) ABSTRACT

A processing apparatus which is suitable for signal communication with a system having at least one of an input module and an output module. The processing apparatus can be configured to receive input signals from the input module of the system. The processing apparatus includes a first channel processing portion to which the input signals are communicable. The first channel processing portion can be configurable to receive and process the input signals in a manner such that bass frequency audio signals are extracted from the input signals. The bass frequency audio signals can be further processed via at least one of linear dynamic range processing, manipulation of dynamic range via compression and manipulation of dynamic range via expansion.

20 Claims, 18 Drawing Sheets

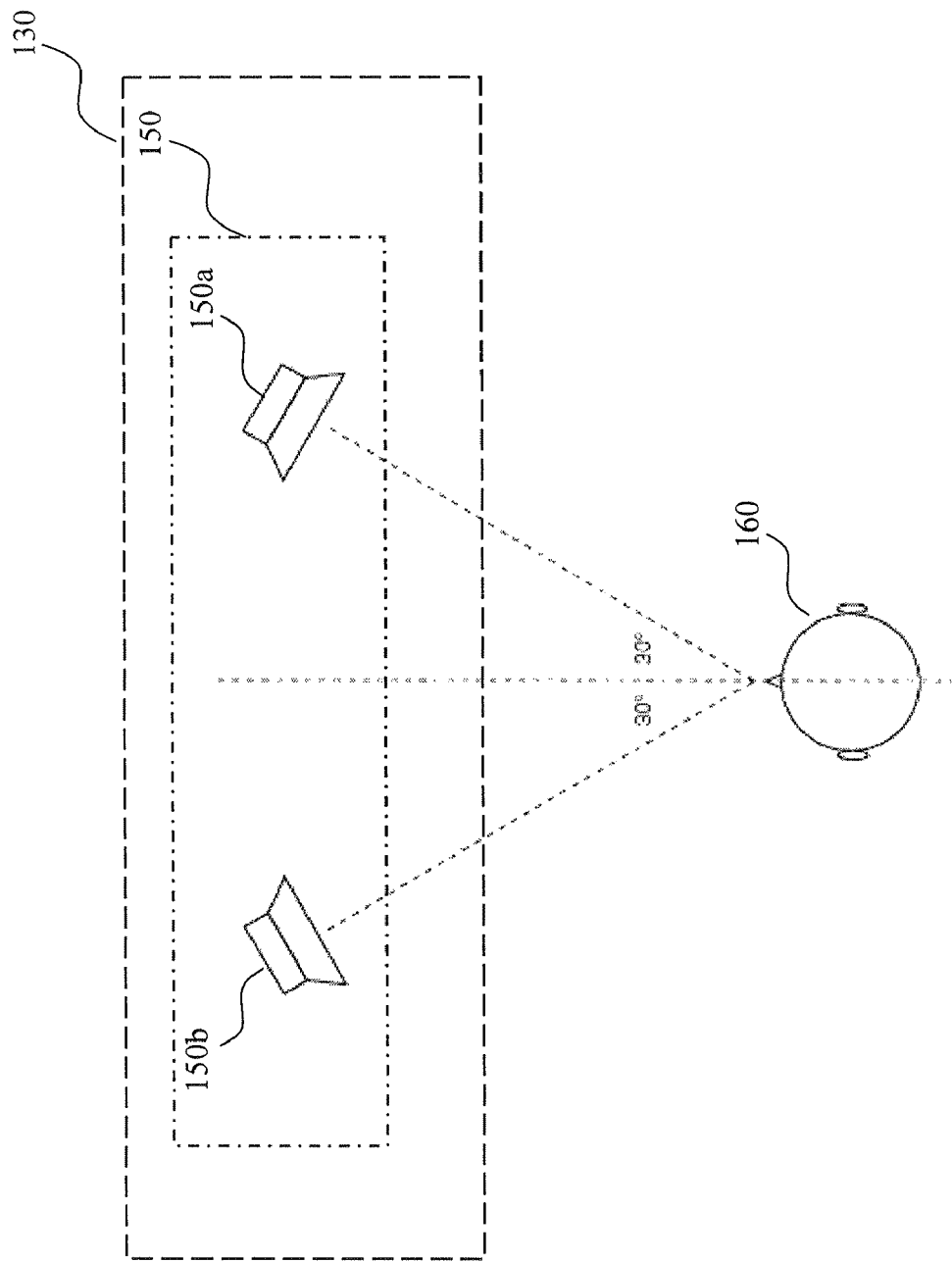

METHOD AND APPARATUS FOR STEREO ENHANCEMENT OF AN AUDIO SYSTEM

FIELD OF INVENTION

The present disclosure generally relates to signal processing of audio signals. More particularly, various embodiments of the disclosure relate to a system, a processing apparatus and a processing method suitable for enhancing stereo audio output of an audio system.

BACKGROUND

In an audio system which produces stereo audio output, it is often desirable improve an aspect of sound performance of the audio system by providing a wide stereo effect to the stereo audio output. Conventional techniques for providing wide stereo effect to a stereo audio output include digital signal processing (DSP) based techniques. For example, a stereo audio output can be digitally manipulated in a DSP system via an algorithm so as to provide a wide stereo effect.

Additionally, audio frequencies nearing lower and higher extremities of the audio range of 20 Hz to 20 KHz are often perceived to have poor sound performance, for example in respect to loudness, as compared to mid-range audio frequencies. Such perceived poor performance can be due to limitation in sensitivity of a human ear to audio frequencies at the aforementioned audio range extremities.

Moreover, an audio system generally has an associated system noise floor. The system noise floor can be associated with noise signals having a loudness level which may adversely affect sound performance if perceived loudness at extremities of the audio range becomes indistinguishable from the loudness level of the noise signals. Particularly, the noise signals may be more audible than audio frequencies nearing lower and higher extremities of the audio range. Thus, noise performance of the audio system may be adversely affected.

Conventional techniques to overcome poor sound performance include providing sufficient gain to compensate the limitation in sensitivity of the human ear, so as to increase perceived loudness of the audio frequencies at the extremities of the audio range. For example, the perceived loudness of audio frequencies at the lower extremity, from 20 Hz to 120 Hz, of the audio range, is lesser than the perceived loudness of mid range audio frequencies, from 300 Hz to 5 KHz. Therefore, more gain is required to boost loudness of the audio frequencies from 20 Hz to 120 Hz as compared to audio frequencies from 300 Hz to 5 KHz.

Unfortunately conventional techniques implemented with respect to improving sound performance of an audio system fail to facilitate improvement of sound performance in a suitably efficient manner.

Moreover, conventional techniques may adversely affect the quality of the stereo audio output of an audio system in a manner which detracts listening experience of a user of the audio system.

It is therefore desirable to provide a solution to address at least one of the foregoing problems of conventional techniques for improving sound performance of an audio system.

SUMMARY OF THE INVENTION

In accordance with a first aspect of the disclosure, a processing apparatus, which is suitable for signal communication with a system having at least one of an input module and an output module, is provided. The processing apparatus can be configured to receive input signals from the input module of the system. The processing apparatus includes a first channel processing portion to which the input signals are communicable. The first channel processing portion can be configured to receive and process the input signals in a manner such that bass frequency audio signals are extracted from the input signals. The bass frequency audio signals can be further processed via at least one of linear dynamic range processing, manipulation of dynamic range via compression and manipulation of dynamic range via expansion.

The first channel processing portion includes a low frequency processing portion and a sub-channel combiner.

The low frequency processing portion includes a first dynamic range compressor (DRC), a splitter coupled to the first DRC and a low frequency adjustment module coupled to the splitter. The first DRC which receives and processes the bass frequency audio signals via at least one of linear dynamic range processing, manipulation of dynamic range via compression and manipulation of dynamic range via expansion. The splitter receives and further processes the processed bass frequency audio signals to produce a first bass portion and a second bass portion. The low frequency adjustment module receives and processes the second bass portion.

The sub-channel combiner module is coupled to the splitter and the low frequency adjustment module. The sub-channel combiner module receives and processes the first bass portion and the processed second bass portion to produce a first channel signal which is communicable to the output module.

The processing apparatus can further include a second channel processing portion to which the input signals are communicable. The second channel processing portion can be configured to receive and process the input signals via manipulation of dynamic range by expansion, thereby producing a second channel signal. The second channel signal can be further communicated to the output module, in addition to the first channel signal.

In accordance with a second aspect of the disclosure, a method for processing signals communicated from an audio source is provided. The signals communicated from the audio source include a left channel audio signal and a right channel audio source. Both the left and right channel audio signals can be processed to produce at least one input combination signal. The method includes a signal processing step which includes a first channel processing step at which the at least one input combination signal is received and processed at a first channel processing portion.

Processing the at least one input combination signal at the first channel processing portion includes an extraction step, a dynamic range processing step, a splitting step, an adjustment step and a combining step.

At the extraction step, bass frequency audio signals are extracted from the at least one input combination signal. At the dynamic range processing step, the bass frequency audio signals can be processed via at least one of linear dynamic range processing, manipulation of dynamic range via compression and manipulation of dynamic range via expansion to produce processed bass frequency audio signals. At the splitting step, the processed bass frequency audio signals can be processed to produce a first bass portion and a second bass portion. At the adjustment step, the second bass portion can be processed to produce a processed second bass portion. At the combining step, the first bass portion and the processed second bass portion can be processed to produce a first channel signal.

BRIEF DESCRIPTION OF THE DRAWINGS

Embodiments of the disclosure are described hereinafter with reference to the following drawings, in which:

FIG. 1c shows a speaker array, included in the output portion of the system of FIG. 1, via which the right and left output signals can be experienced by a user of the system of FIG. 1.

FIG. 2b shows, in further detail, the input module of the exemplary embodiment of the system shown in FIG. 2a;

FIG. 2c and FIG. 2d show, in further detail, the processing apparatus of the exemplary embodiment of the system shown in FIG. 2a;

FIG. 2e shows, in further detail, the output module of the exemplary embodiment of the system shown in FIG. 2a;

FIG. 8 shows an output graph depicting frequency response at the output module of the exemplary embodiment of the system shown in FIG. 2a.

DETAILED DESCRIPTION

Representative embodiments of the disclosure, for addressing one or more of the foregoing problems associated with conventional techniques for improving sound performance of an audio system, are described hereinafter with reference to FIG. 1 to FIG. 9.

Figure 1A:
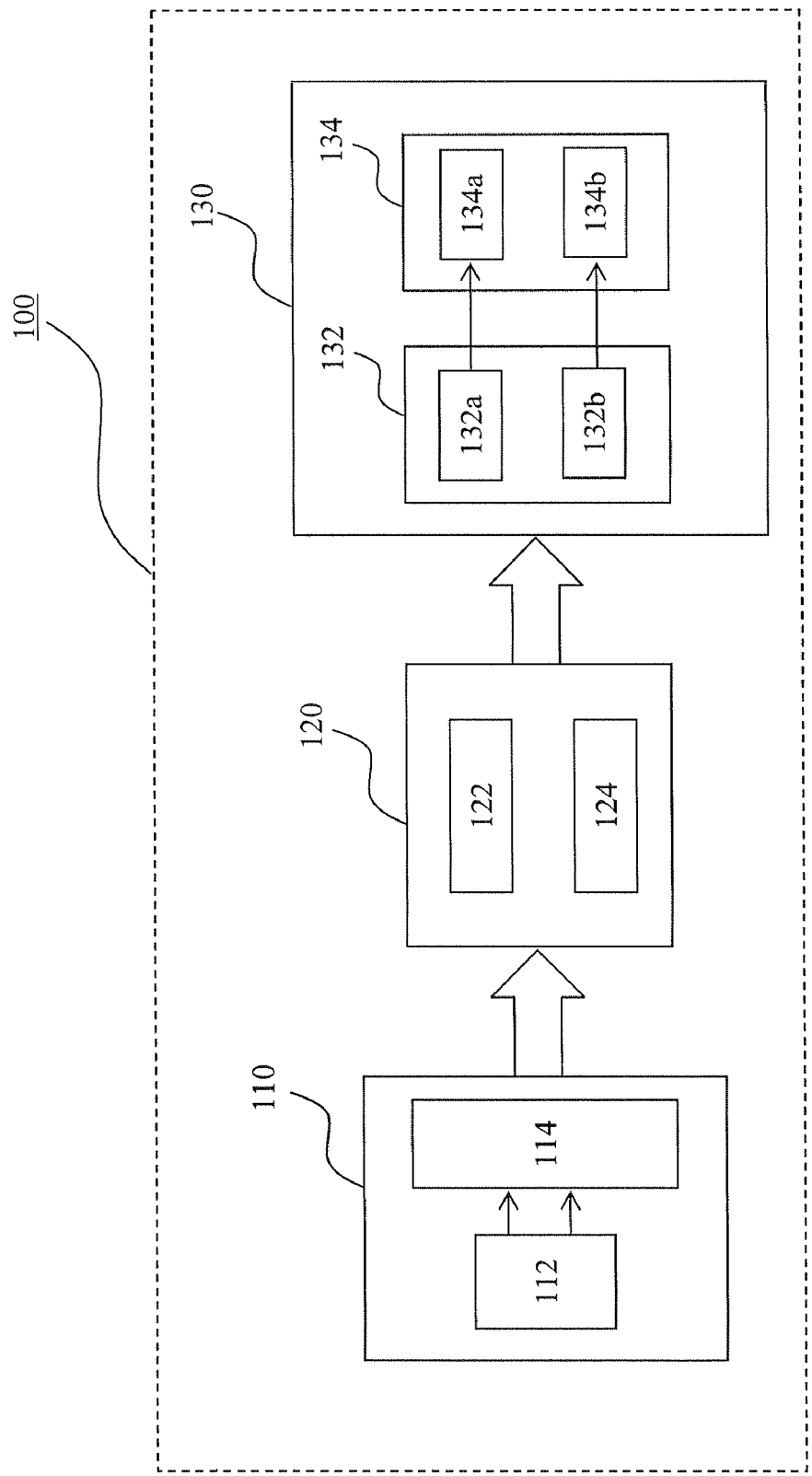
FIG. 1a shows a system which includes an input module to which an audio source producing left and right channel audio signals can be coupled, a processing apparatus having a low frequency adjustment module, and an output module via which left and right output signals can be produced, according to an embodiment of the disclosure.

A system 100, in accordance with an embodiment of the disclosure, which includes an input module 110, a processing apparatus 120 and an output module 130, is shown in FIG. 1a. The input module 110 is coupled to the processing apparatus 120 which is coupled to the output module 130.

The input module 110 includes an audio source input portion 112 and a mixer portion 114 which is coupled to the audio source input portion 112. The audio source input portion 112 can be coupled to an audio source (not shown) which produces a left channel audio signal and a right channel audio signal.

Each of the left and right channel audio signals is associable with a magnitude which is indicative of signal strength, which is in turn associable with loudness level. The audio source can have an adjustable gain module which provides an adjustable gain with respect to the magnitude of each of the left and right channel audio signals. The adjustable gain can be adjusted to vary reference gain level which can be used to one of boost and attenuate the magnitude of each of the left and right channel audio signals. More specifically, based on an adjustment of the adjustable gain using the adjustable gain module, a reference gain level for the magnitude of each of the left and right channel audio signals can be obtained. Multiple adjustments of the adjustable gain using the adjustment gain module result in corresponding multiple reference gain levels. An example of the adjustable gain module is a volume control associated with the audio source. The volume control can be used to increase or reduce the adjustable gain and thus, correspondingly increase or reduce the reference gain level. If the reference gain level is increased, magnitude of each of the left and right channel audio signals is correspondingly boosted. Conversely, if the reference gain level is reduced, magnitude of each of the left and right channel audio signals is correspondingly attenuated.

Each of the left and right channel audio signals (symbolized as "L" and "R", respectively, in equation (1) and equation (2) below) can be received by the audio source input portion 112. The input module 110 processes the received left and right channel audio signals, via the mixer portion 114, to form one or more input combination signals. The received left and right channel audio signals can be processed by the mixer portion 114 via one or both of in-phase processing and out-of-phase processing.

The input combination signals can be communicated to, and received by, the processing apparatus 120 from the input module 110. Depending on whether the received left and right channel audio signals are processed by the mixer portion 114 via in-phase processing or out-of-phase processing, each input combination signal can be either an in-phase/summed input combination signal (symbolized as "M" in equation (1)) or an out-of-phase/subtracted input combination signal (symbolized as "S" in equation (2)) as represented by equation (1) and equation (2), respectively, below:

$$M = L + R \tag{1}$$

$$S = L - R \tag{2}$$

As seen in equations (1) and (2), an in-phase input combination signal can be formed based on a summation of the left channel audio and right channel audio signals whereas an out-of-phase input combination signal can be formed based on a subtraction between the left channel audio and right channel audio signals.

The processing apparatus 120 processes the input combination signals to produce processed sub-signals. The processing apparatus 120 includes one or both of a first channel processing portion 122 and a second channel processing portion 124, each of which can be coupled to the input module 110. More specifically, the first and second channel processing portions 122/124 can each be coupled to the mixer portion 114 of the input module 110.

The first and second channel processing portions 122/124 receive at least one in-phase input combination signal and at least one out-of-phase input combination signal, respectively, from the input module 110.

Thus the first channel processing portion 122 is associated with in-phase processing and the second channel processing portion 124 is associated with out-of-phase processing. Therefore in-phase processed sub-signals (symbolized as "Sub 1" in equation (3) below) and out-of-phase processed sub-signals (symbolized as "sub 2" in equation (4) below) are produced by the first channel processing and second channel processing portions 122/124 respectively. Additionally, each of the first and second channel processing portions 122/124 can be associable with a multiplication factor symbolized as "K1" and "K2" respectively. Sub 1 and Sub 2 are represented by equation (3) and equation (4), respectively, below:

$$Sub1 = K1 * M = K1 * (L+R) \quad (3)$$

$$Sub2 = K2 * S = K2 * (L-R) \quad (4)$$

Each of the respective multiplication factors K1 and K2 for the first and second channel processing portions 122/124 can be a gain factor, an attenuation factor or a unity factor. In one example, K1 can be a gain factor which doubles magnitude of Sub 1 (i.e., K1=2) and K2 can be an attenuation factor halving magnitude of Sub 2 (i.e., K2=0.5). In another example, both K1 and K2 can be unity factors (i.e., K1=K2=1) such that magnitudes of both Sub 1 and Sub 2 are not affected by respective K1 and K2.

The output module 130 receives the processed sub signals from the processing apparatus 120 and further processes them to produce output signals which include a left output signal (symbolized as Lout in equation (5) below) and a right output signal (symbolized as Rout in equation (6) below). The output module 130 includes a combiner portion 132 and an output portion 134. The combiner portion 132 couples the processing apparatus 120 and the output portion 134.

The combiner portion 132 includes a first combiner 132a and a second combiner 132b. The output portion 134 includes a first output port 134a to which the left output signal corresponds and a second output port 134b to which the right output signal corresponds. The first and second output ports 134a/134b are coupled to the first and second combiners 132a/132b respectively.

The output module 130 can be associable with a multiplication factor at, for example, each of the first and second output ports 134a/134b or each of the first and second combiners 132a/132b. For example, where the output module 130 is associable with a multiplication at each of the first and second output ports 134a/134b, the multiplication factor for each thereof can be symbolized as "G1" and "G2" respectively.

Additionally, each of the first and second combiners 132a/132b can either combine Sub 1 and Sub 2 via summation (i.e., Sub 1+Sub 2) or combine Sub 1 and Sub 2 via subtraction (i.e., Sub 1−Sub 2).

For example, where the first combiner 132a combines Sub 1 and Sub 2 via summation and where the second combiner 132a combines Sub 1 and Sub 2 via subtraction, the left output signal (symbolized as Lout in equation (5) below) and the right output signal (symbolized as Rout in equation (6) below) can be represented by equation (5) and equation (6), respectively, below:

$$Lout = G1 * (Sub1+Sub2) = G1 * (K1*(L+R)+K2*(L-R)) \quad (5)$$

$$Rout = G2 * (Sub1-Sub2) = G2 * (K1*(L+R)-K2*(L-R)) \quad (6)$$

As with the earlier described K1 and K2, G1 and G2 can each be a gain factor, an attenuation factor or a unity factor. Thus the earlier description in relation to K1 and K2 analogously applies to G1 and G2.

Assuming K1, K2, G1 and G2 are each a unity factor (i.e., K1=K2=G1=G2=1), equation (5) and equation (6) in the above example can be simplified as shown in equation (7) and equation (8), respectively, below:

$$Lout = 2L \quad (7)$$

$$Rout = 2R \quad (8)$$

In general, the left output signal and the right output signal (symbolized as "Lout" and "Rout" respectively in equations 7 and 8 above), in combination, correspond to stereo audio output of the system 100.

Figure 1B:
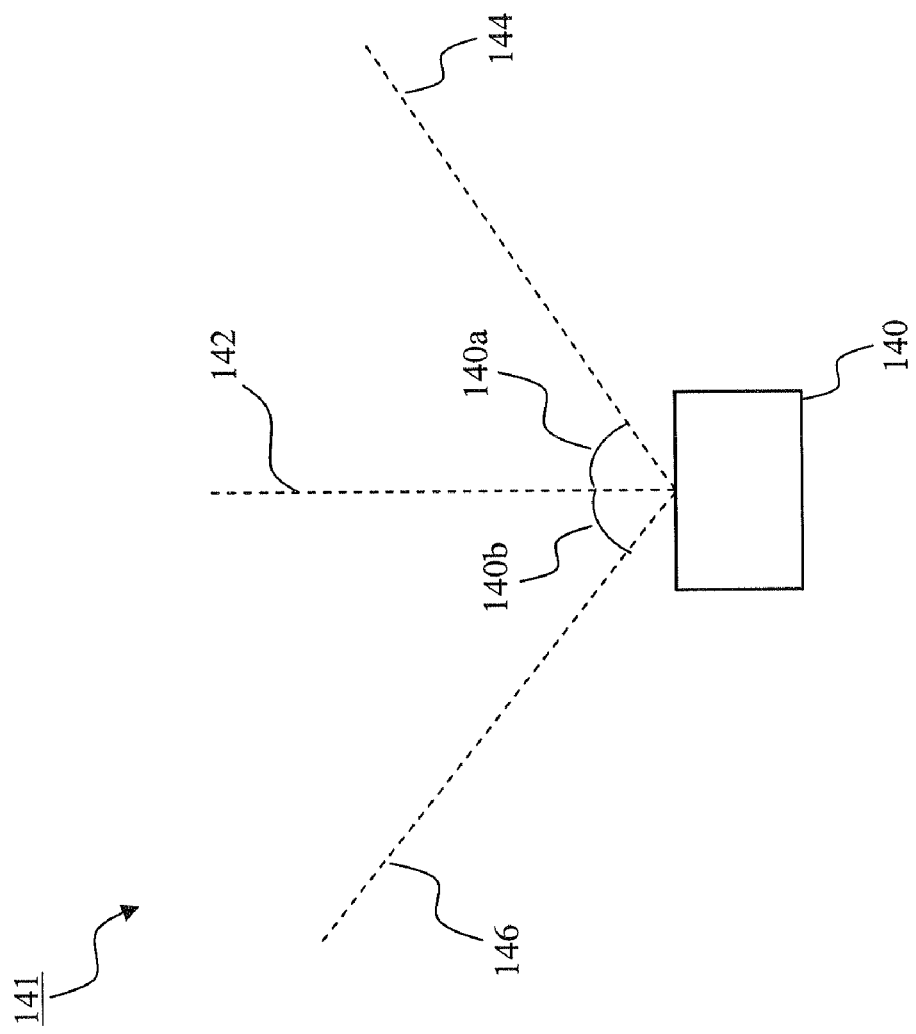
FIG. 1b illustrates an exemplary scenario wherein the right and left channel audio signals from the audio source mentioned in FIG. 1 can be recorded by a recording device.

Referring to FIG. 1b, the right and left channel audio signals from the aforementioned audio source can be recorded by a recording device 140 based on an exemplary scenario 141 wherein the right and left channel audio signals are recorded based, respectively, on a predetermined right recording angle 140a and a predetermined left recording angle 140b.

The recording device 140 is associable with a recording incident axis 142. The recording device 140 is further associable with a right recording axis 144 and a left recording axis 146. The predetermined right recording angle 140a is based on angle separation between the recording incident axis 142 and the right recording axis 144. The predetermined left recording angle 140b is based on angle separation between the recording incident axis 142 and the left recording axis 146. The predetermined right and left recording angles 140a/140b can, for example, be an angle of 30 degrees each.

Referring to FIG. 1c, the output portion 134 can include a speaker array 150 which includes a right speaker 150a and a left speaker 150b for the right and left output signals respectively. A user 160 of the system 100 experiences the right and left output signals via the speaker array 150.

For optimized stereo audio experience, it is preferable that tonality of soundstage is preserved. Soundstage can generally be associated with considerations such as sense of width, depth and height of the stereo audio output (i.e., the left and right output signals) as experienced by the user 160 when listening to the stereo audio output from the speaker array 150.

More specifically, tonality of soundstage is indicative of the extent to which original recordings, by the recording device 140, of the location associated with left and right channel audio signals, such as instruments and vocalists as they were positioned during recording, is faithfully reproduced at the speaker array 150.

For example, assuming considerations such as multiplication factors (for example, the aforementioned K1, K2, G1 and G2) associated the system 100 are disregarded, tonality of soundstage can be associated with extent of faithful reproduction, as right and left output signals at the speaker array 150, of the corresponding right and left channel audio signals as originally recorded by the recording device 140.

Therefore tonality of soundstage can generally be considered preserved when the right and left channel audio signals are substantially faithfully reproduced as corresponding right and left output signals at the speaker array 150. Conversely, tonality of soundstage can generally be considered compromised when the right and left channel audio signals are not substantially faithfully reproduced as corresponding right and left output signals at the speaker array 150. For example, if the sense of any of the width, depth and height, associated with the right and left channel audio signals, originally recorded by the recording device 140 is not substantially faithfully reproduced at the speaker array 150, tonality of soundstage can be considered compromised.

Tonality of soundstage can, for example, be preserved by arranging or positioning the right and left speakers 150a/150b substantially in accordance with the respective predetermined right and left recording angles 140a/140b. For example, in accordance with the abovementioned exemplary scenario 141 wherein the predetermined right and left recording angles 140a/140b are 30 degrees each, the right and left speakers 150a/150b can be positioned, correspondingly, at an angle of 30 degrees each with respect to the user 160.

An exemplary embodiment of the system 100 will be discussed hereinafter with respect to FIG. 2a to FIG. 2e.

Figure 2A:
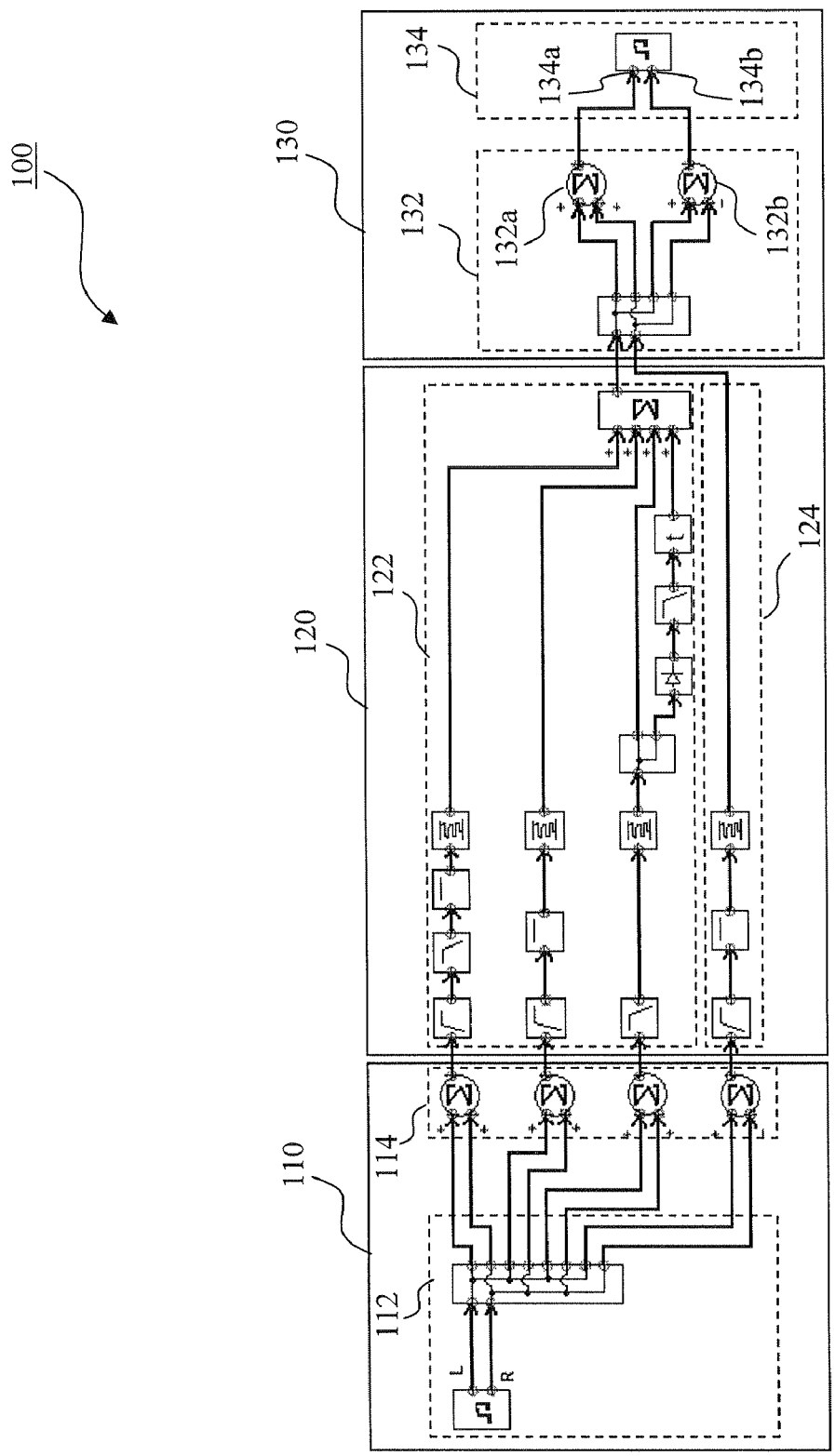
FIG. 2a shows an overview of an exemplary embodiment of the system of FIG. 1.

FIG. 2a provides an overview of the exemplary embodiment of the system 100, in which the input module 110, the processing apparatus 120 and the output module 130 are illustrated in further detail. The input module 110, the processing apparatus 120 and the output module 130 are, individually, further illustrated in FIG. 2b, FIG. 2c to FIG. 2d and FIG. 2e, respectively.

Figure 2B:
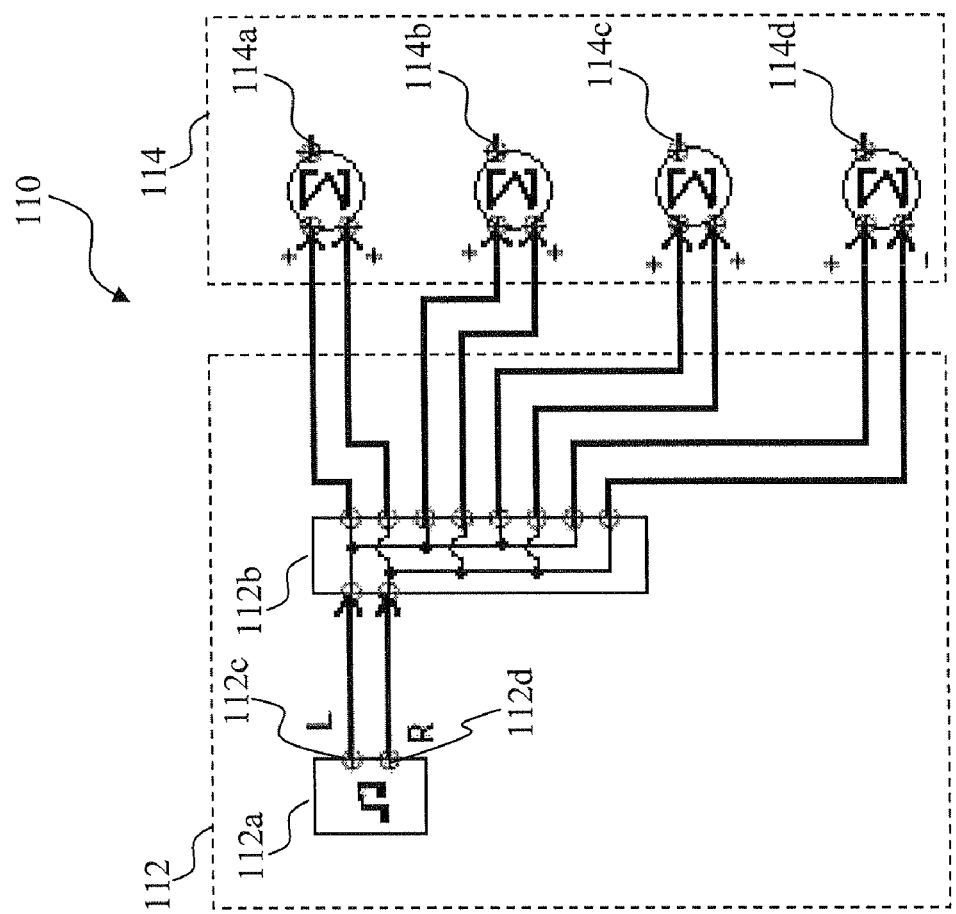

Referring to FIG. 2a and FIG. 2b, at the input module 110, the audio source input portion 112 includes an input port portion 112a and a channel splitter portion 112b. The input port portion 112a includes a first input port 112c and a second input port 112d, each of which is coupled to the channel splitter portion 112b. The left audio channel and right audio channel signals which are respectively received via the first and second input ports 112c/112d, are subsequently fed to the channel splitter portion 112b.

Additionally, the mixer portion 114 includes a mixer array having at least one mixer. As shown in FIG. 2b, the mixer portion 114 includes a mixer array having, for example, a first mixer 114a, a second mixer 114b, a third mixer 114c and a fourth mixer 114d.

Based on the left audio channel and right audio channel signals received, the channel splitter portion 112b produces one or more sets of left input signal and right input signal pair, the number of pairs of which preferably corresponds to the number of mixers in the mixer array of the mixer portion 114. For example, for each of the first to fourth mixers 114a/114b/114c/114d, a set of left and right input signal pair is produced.

Each mixer in the mixer array of the mixer portion 114 processes the received set of left and right input signal pair to produce an input combination signal which can be either an in-phase input combination signal or an out-of-phase input combination signal.

Figure 2C:
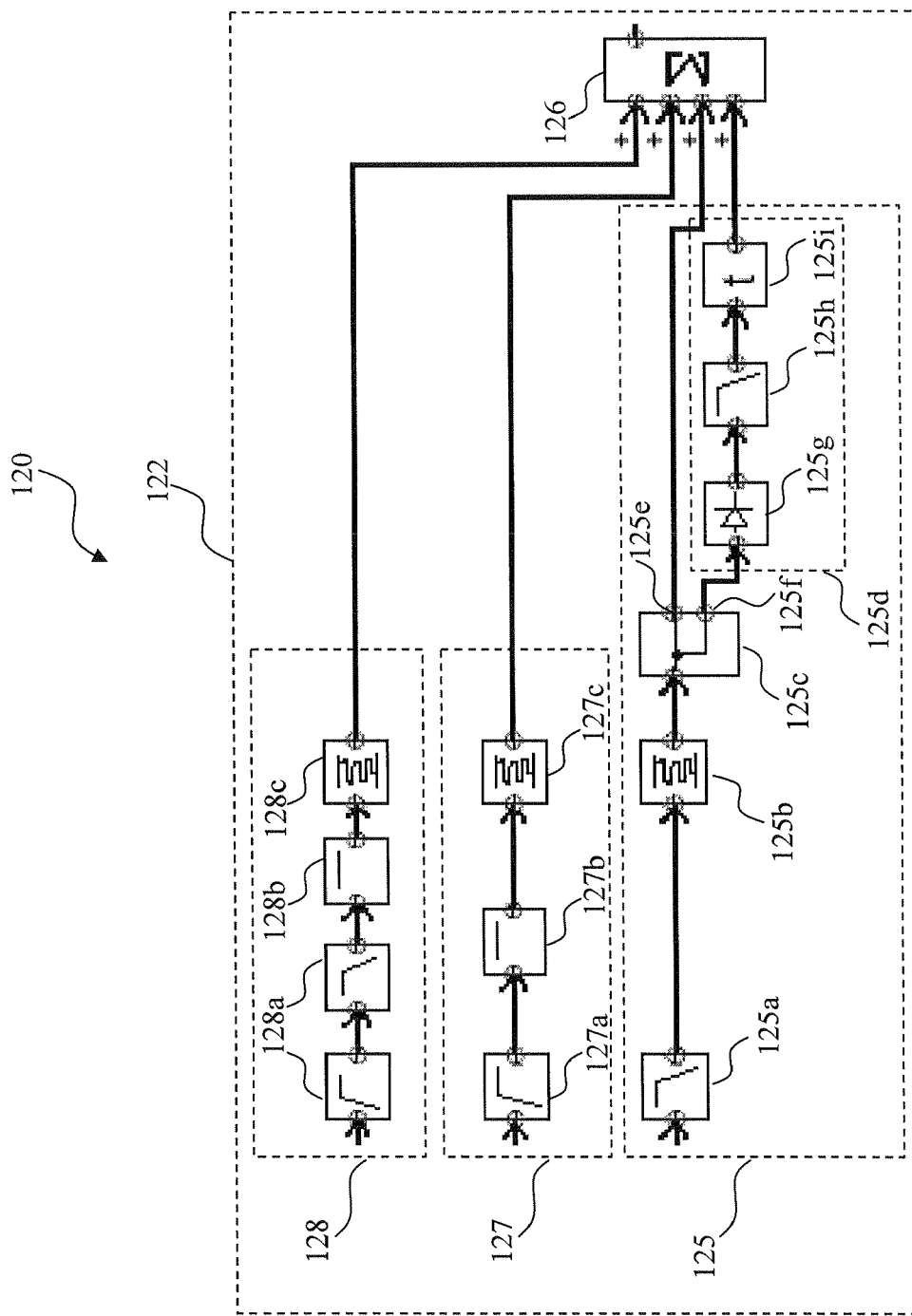
Figure 2D:
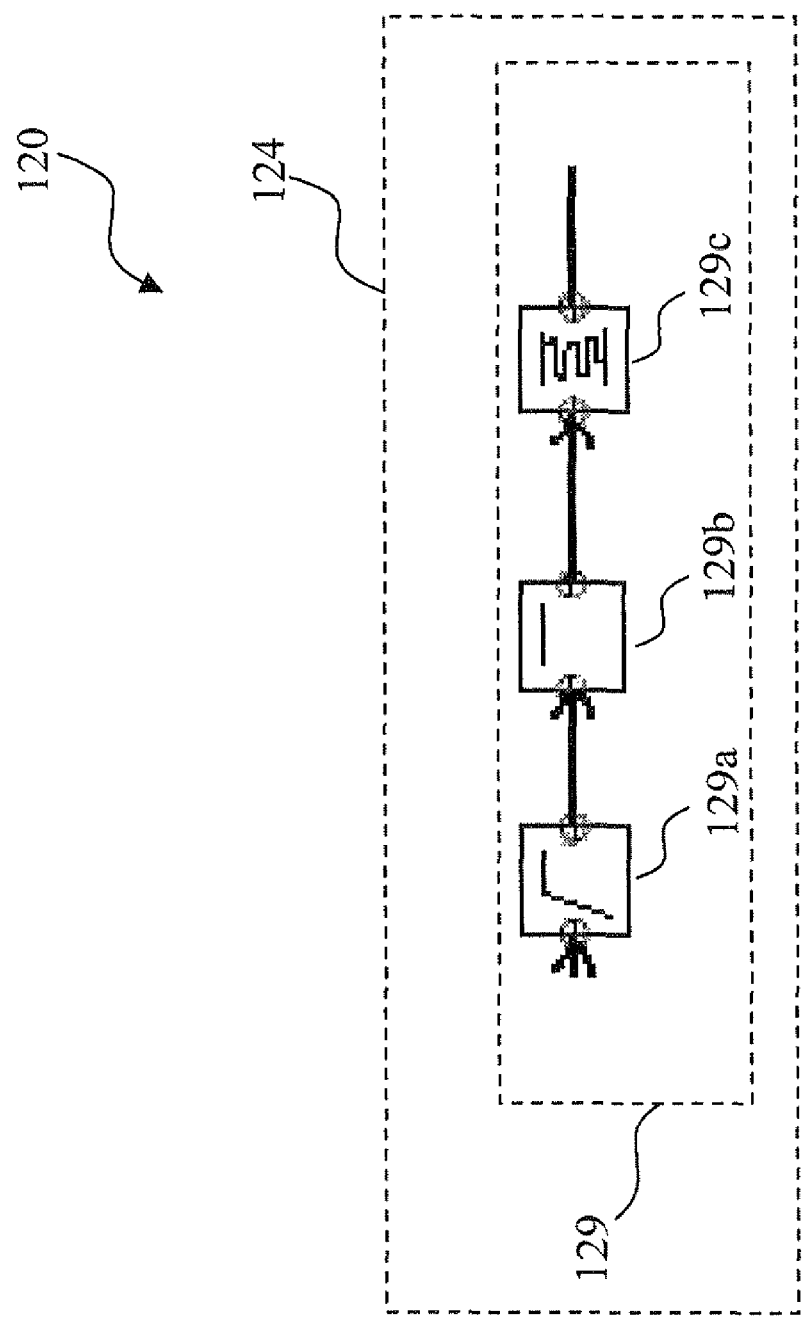

Referring to FIG. 2a, FIG. 2c and FIG. 2d, at the processing apparatus 120, the first channel processing portion 122, in one embodiment, includes a low frequency processing portion 125 and a sub-channel combiner module 126 which has a plurality of input ports and an output port. As shown, the low frequency processing portion 125 is coupled to the sub-channel combiner module 126. In another embodiment, the first channel processing portion 122 further includes at least one of a high frequency processing portion 127 and a mid-range frequency processing portion 128. As shown, each is the high frequency processing portion 127 and the mid-range frequency processing portion 128 can be coupled to the sub-channel combiner module 126. The second channel processing portion 124 includes a soundstage processing portion 129.

The first channel processing portion 122 will be described in more detail hereinafter with reference to FIG. 2a and FIG. 2c, while the second processing portion 124 will be described later in more detail with reference to FIG. 2a and FIG. 2d.

As shown in FIG. 2a and FIG. 2c, the low frequency processing portion 125 includes a first filter 125a which is coupled to a mixer in the mixer array of the mixer portion 114, and which receives the input combination signal therefrom. The low frequency processing portion 125 also includes a first dynamic range compressor (DRC) 125b having an input and an output, a splitter 125c and a low frequency adjustment module 125d. The input and output of the first DRC 125b are coupled, respectively, to the first filter 125a and the splitter 125c. Thus, the first DRC 125b couples the first filter 125a and the splitter 125c.

The splitter 125c has a first splitter output 125e which is coupled to one of the input ports of the sub-channel combiner module 126 and a second splitter output 125f which is coupled to the low frequency adjustment module 125d.

The low frequency adjustment module 125d includes a harmonic generator 125g which is coupled to the second splitter output 125f, a second filter 125h which is coupled to the harmonic generator 126g and a shifter 125i which couples the second filter 125h to one of the input ports of the sub-channel combiner module 126.

The first filter 125a has filter characteristics in association thereto and is, for example, a low pass filter which can be configured to filter the input combination signal such that bass frequency audio signals, such as a 50 Hz audio signal, are received and processed by the first DRC 125b whereas mid-range to high frequency audio signals having frequencies above, for example, 300 Hz are filtered off and receipt by the first DRC 125b thereof can thus be impeded. Therefore, the first filter 125a can be configured such that bass frequency audio signals can be extracted from the input combination signal for further processing by the first DRC 125b.

The first filter 125a can be configured, as mentioned above, by appropriate consideration as to its filter characteristics. Filter characteristics can include parameters such as type of filter, filter order and −3 dB cutoff frequency.

An example of a low pass filter is a first order low pass Butterworth filter having a −3 dB cutoff frequency within a frequency range of 70 Hz to 300 Hz. Other examples of a low pass filter include a first order low pass Butterworth filter having −3 dB cutoff frequencies below 70 Hz, such as a −3 dB cutoff frequency of 50 Hz.

The first DRC 125b is capable of linear dynamic range processing the bass frequency audio signals, received at its input, to produce processed bass frequency audio signals at its output. More specifically, the first DRC 125b is capable of processing the bass frequency audio signals such that magnitude of each bass frequency audio signal at the input of the first DRC 125b is substantially similar to magnitude of each corresponding processed bass frequency audio signal at the output of the first DRC 125b.

The first DRC 125b is also capable of processing the bass frequency audio signals, received at its input, to produce processed bass frequency audio signals at its output by manipulating dynamic range, such that difference between magnitude of each bass frequency audio signal at the input of the first DRC 125b and magnitude of each corresponding processed bass frequency audio signal at the output of the first DRC 125b, is variable. The aforementioned difference between magnitude at the input of the first DRC 125b and magnitude at the output of the first DRC 125b can be varied by manipulation of dynamic range, via the first DRC 125b, by one of compression and expansion.

In one embodiment, the first DRC 125b manipulates dynamic range by compression to produce processed bass frequency audio signals at its output. In another embodiment, the first DRC 125b manipulates dynamic range by expansion to produce processed bass frequency audio signals at its output. In this respect, difference between magnitude of each bass frequency audio signal at the input of the first DRC 125b and magnitude of each corresponding processed bass frequency audio signal at the output of the first DRC 125b, is lesser via manipulation of dynamic range by compression as compared to manipulation of dynamic range by expansion. In yet another embodiment, the first DRC 125b manipulates dynamic range by compression and expansion to produce processed bass frequency audio signals at its output.

The first DRC 125b will also be discussed later, in further detail, with respect to FIGS. 4 and 6.

After processing by the first DRC 125b, the processed bass frequency audio signals are communicated to the splitter 125c and further processed such that the processed bass frequency audio signals are split into a first bass portion and a second bass portion. The first bass portion is received by an input of the sub-channel combiner module 126 via the first splitter output 125e of the splitter 125c. The second bass portion is received by the low frequency adjustment module 125d via the second splitter output 125f of the splitter 125c. The low frequency adjustment module 125d produces a processed second bass portion.

Preferably, both first and second bass portions from the first and second splitter outputs 125e/125f are substantially identical. More specifically, bass frequency audio signals can be associated with the first and second bass portions, and the bass frequency audio signals associated with the first and second bass portions are preferably substantially identical. For example, where the first bass portion is associable with a bass frequency audio signal having a frequency of 50 Hz, the second bass portion is similarly associable with a bass frequency audio signal having a frequency of 50 Hz.

The second bass portion is fed to the harmonic generator 125g and processed such that harmonics of a fundamental bass frequency signal within the bass frequency audio signals associated with the second bass portion are generated. The generated harmonics can include high order harmonics and low order harmonics. The generated harmonics can, for example, be processed by the second filter 125h such that communication of the high order harmonics to the shifter 125i is impeded whereas the low order harmonics are received by the shifter 125i.

After processing of the generated harmonics by the second filter 125h, the low order harmonics can be processed by the shifter 125i such that there is an offset between harmonics of the fundamental bass frequency signal and the bass frequency audio signals associated with the first bass portion. The low order harmonics can be processed by the shifter 125i by, for example, time shifting and the offset can be, for example, a time delay between harmonics of the fundamental bass frequency signal and the bass frequency audio signals associated with the first bass portion.

The processed second bass portion and the first bass portion are both subsequently fed to, and processed by, the sub-channel combiner 126, as will be described later in greater detail.

The harmonic generator 125g can, for example, be a rectifier which can include a DC offset remover. The rectifier can, for example, be implemented via a diode, capacitor and resistor combination. The second filter 125h can, for example, be a low pass filter.

As mentioned earlier, conventional techniques to overcome poor sound performance at the lower extremity of the audio frequency range may adversely affect quality of stereo audio output. For example, power associated with harmonics of the fundamental bass frequency signal can be harnessed to improve sound performance at the lower extremity of the audio frequency range. However, quality of the stereo audio output may be adversely affected due to an effect wherein fidelity of bass frequency audio signals is compromised when power associated with the fundamental bass frequency signal is harnessed. The low frequency adjustment module 125d mitigates such an effect, thus sound performance at the lower extremity of the audio frequency range can be improved without adversely affecting quality of stereo audio output.

The foregoing in relation to the low frequency adjustment module 125d will be discussed later, in further detail, with respect to FIGS. 3a to 3e.

Further mentioned earlier, an audio system generally has an associated system floor noise which can be associated with noise signals which may adversely affect noise performance of the audio system. In this regard, the low frequency processing portion 125 can be configured to mitigate such poor noise performance via at least one of the first filter 125a and the first DRC 125b.

More specifically, the low frequency processing portion 125 can, in one embodiment, be configured, by appropriate considerations as to filter characteristics associated with the first filter 125a, such that the aforementioned noise signals associated with system noise floor can be substantially filtered away by the first filter 125a. For example, 3 dB cutoff frequency of the first filter can be configured based on a cutoff frequency in association with the noise signals. Communication of the noise signals to the first DRC 125b can therefore be impeded.

In another embodiment, the low frequency processing portion 125 can be configured such that bass audio frequency signals associated with low level magnitudes can be processed to produce processed bass audio frequency signals which can be distinguished from the aforementioned noise signals by appropriately configuring the first DRC 125b to manipulate dynamic range by expansion, as will be discussed further with respect to FIG. 6.

In yet another embodiment, the low frequency processing portion 125 can be configured to mitigate the abovementioned poor noise performance via a combination of the first filter 125a and the first DRC 125b.

Further shown in FIG. 2a and FIG. 2c, the high frequency processing portion 127 includes a third filter 127a which is coupled to a mixer in the mixer array of the mixer portion 114, and which receives the input combination signal therefrom. The high frequency processing portion 127 further includes a second shifter 127b and a second DRC 127c having an input and an output. The second shifter 127b couples the third filter 127a to the input of the second DRC 127c. The output of the second DRC 127c is coupled to one of the input ports of the sub-channel combiner module 126. Thus, the second DRC 127c couples the second shifter 127b to the sub-channel combiner module 126.

The third filter 127a has filter characteristics in association thereto and is, for example, a high pass filter which is configured to filter the input combination signal such that high audio frequency signals having audio frequencies above, for example, 2 KHz are received and processed by the second DRC 127c whereas bass to mid-range audio frequency signals having frequencies below, for example, 2 KHz are filtered off and receipt by the second DRC 127c thereof can thus be impeded. An example of a high pass filter is a first order high pass Butterworth filter having a −3 dB cutoff frequency at 2 KHz. Therefore, the third filter 127a can be configured such that high audio frequency signals can be extracted from the input combination signal for further processing by the second DRC 127c.

As earlier mentioned, filter characteristics can include parameters such as type of filter, filter order and −3 dB cutoff frequency.

The second shifter 127b is, for example, an all pass filter (APF) which functions to phase shift high audio frequency signals received from the second filter 127a so as to compensate phase shift due to, for example, propagation delay incurred during signal processing at the input module 110.

The second DRC 127c receives the phase shifted high audio frequency signals from the second shifter 127b and processes them in a manner which is analogous to the first DRC 125b, thus producing processed high audio frequency signals.

The second DRC 127c will also be discussed later, in further detail, with respect to FIGS. 4 and 6.

The sub-channel combiner module 126 subsequently receives and further processes the processed high audio frequency signals, as will be described later in greater detail.

Referring yet again to FIG. 2a and FIG. 2c, the mid-range frequency processing portion 128 includes a fourth filter 128a which is coupled to a mixer in the mixer array of the mixer portion 114, and which receives the input combination signal therefrom. The mid-range frequency processing portion 128 also includes a third shifter 128b and a third DRC 128c having an input and an output. The third shifter 128b couples the fourth filter 128a to the input of the third DRC 128c. The output of the third DRC 128c is coupled to one of the input ports of the sub-channel combiner module 126. Thus, the third DRC 128c couples the third shifter 128b to the sub-channel combiner module 126.

In one embodiment, the fourth filter 128a is a bandpass filter having a high pass cutoff portion which −3 dB cutoff frequency corresponds to the −3 dB cutoff frequency of the first filter 125a and a low pass cutoff portion which −3 dB cutoff frequency corresponds to the −3 dB cutoff frequency of the third filter 127a. In another embodiment, the fourth filter 128a is a combination of a lowpass filter which −3 dB cutoff frequency corresponds to the −3 dB cutoff frequency of the third filter 127a and a highpass filter which −3 dB cutoff frequency corresponds to the −3 dB cutoff frequency of the first filter 125a.

In this regard, the foregoing discussion relating to the first and third filters 125a/127a analogously applies.

Thus the fourth filter 128a filters the input combination signal such that mid-range audio frequency signals having audio frequencies between, for example, 70 Hz and 2 KHz are received and processed by the third DRC 128c whereas bass and high audio frequency signals having frequencies, for example, below 70 Hz and above 2 KHz, respectively, are filtered off and receipt by the third DRC 128c thereof can thus be impeded. Therefore, the fourth filter 128a can be configured such that mid-range audio frequency signals can be extracted from the input combination signal for further processing by the third DRC 128c.

The third shifter 128b is analogous to the second shifter 127b. In this regard, the foregoing discussion relating to the second shifter 127b analogously applies.

The third DRC 128c receives the phase shifted mid-range audio frequency signals from the third shifter 128b and processes them in a manner which is analogous to any one of the first and second DRCs 125b/127c, thus producing processed mid-range audio frequency signals.

The third DRC 128c will also be discussed later, in further detail, with respect to FIGS. 4 and 6.

The sub-channel combiner module 126 subsequently receives and further processes the processed mid-range audio frequency signals, as will be described in greater detail hereinafter.

In one embodiment, the sub-channel combiner module 126 receives, at its input ports, the processed second bass portion and the first bass portion from the low frequency processing portion 125. The received first bass and processed second bass portions can be processed by the sub-channel combiner module 126 via in-phase processing/summation, to produce a first channel signal at its output port.

In another embodiment, the sub-channel combiner module 126 further receives, at its input ports, either the processed high audio frequency signals from the high frequency processing portion 127 or the processed mid-range audio frequency signals from the mid-range frequency processing portion 128. Either the received processed high audio frequency signals or the received processed mid-range audio frequency signals can be processed by the sub-channel combiner module 126 in combination with the received first bass portion and received processed second bass portion via in-phase processing/summation, to produce a first channel signal at its output port.

In a yet another embodiment, the sub-channel combiner module 126 further receives, at its input ports, the processed high audio frequency signals and the processed mid-range audio frequency signals from the high frequency processing portion 127 and the mid-range frequency processing portion 128, respectively. The received processed high audio frequency signals and the received processed mid-range audio frequency signals can be processed by the sub-channel combiner module 126 in combination with the received first bass portion and received processed second bass portion via in-phase processing/summation, to produce a first channel signal at its output port.

The first channel signal, which is subsequently received by the output module 130, corresponds to the earlier described Sub 1 of FIG. 1.

The second channel processing portion 124, which includes the sound stage processing portion 129 as earlier mentioned, will be described hereinafter in more detail with reference to FIG. 2a and FIG. 2d.

Referring to FIG. 2a and FIG. 2d, the sound stage processing portion 129 includes a fifth filter 129a which is coupled to a mixer in the mixer array of the mixer portion 114, and which receives the input combination signal therefrom. The sound stage processing portion 129 further includes a fourth shifter 129b and a fourth DRC 129c having an input and an output. The fourth shifter 129b couples the fifth filter 129a to the input of the fourth DRC 129c. The output of the fourth DRC 129c is coupled to the output module 130. Thus, the fourth DRC 129c couples the fourth shifter 129b to the output module 130.

The fifth filter 129a and the fourth shifter 129b are analogous to the high pass cutoff portion associated with the fourth filter 128a and the second shifter 127b respectively. In this regard, the foregoing description in relation to the fourth filter 128a and the second shifter 127b analogously applies.

The fourth DRC 129c receives, at its input, phase shifted audio frequency signals from the fourth shifter 129b and processes them in a manner which is analogous to any one of the first, second and third DRCs 125b/127c/128c, thus producing a second channel signal at its output.

As mentioned earlier, conventional techniques to improve sound performance by providing a wide stereo effect to the stereo audio output may affect quality of stereo audio output.

For example, although wide stereo effect may be provided to the stereo audio output, quality of the stereo audio output may be adversely affected due to an effect wherein tonality of soundstage is compromised.

The fourth DRC 129c can be configured to mitigate the effect wherein tonality of soundstage is compromised whilst providing wide stereo effect to the stereo audio output of the system 100, as will be discussed later with reference to FIGS. 4 to 6. The fourth DRC 129c can further be configured to improve directivity of the stereo audio output of the system 100 at the output portion 134, as will also be discussed later with reference to FIG. 7.

The second channel signal, which is subsequently received by the output module 130, corresponds to the earlier described Sub 2 of FIG. 1.

Figure 2E:
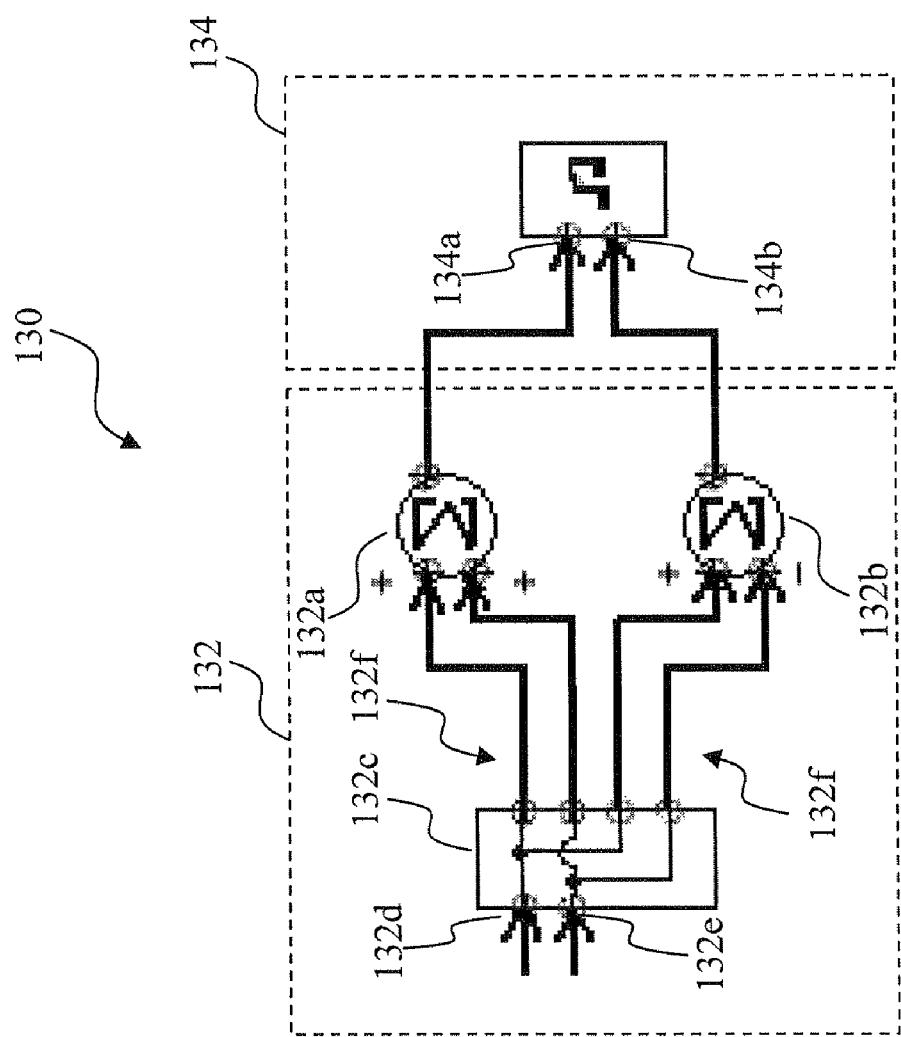

Referring to FIG. 2a and FIG. 2e, at the output module 130, the combiner portion 132 further includes a receiver portion 132c which is coupled to the processing apparatus 120. The receiver portion 132c includes a first receiver input port 132d, a second receiver input port 132e, and a plurality of receiver output ports 132f which are coupled to the first and second combiners 132a/132b. The first and second receiver input ports 132d/132e receives the first channel and second channel signals respectively.

The receiver portion 132c processes the received first channel and second channel signals in a manner, for example via signal splitting techniques, such that both the first channel and second channel signals are received by each of the first and second combiners 132a/132b.

Each of the first and second combiners 132a/132b processes the received first channel and second channel signals from the receiver portion 132c to produce the left output and right output signals, respectively, of FIG. 1 (i.e., Lout and Rout, respectively).

The left output and right output signals can subsequently be received at the first and second output ports 134a/134b, respectively, of the output portion 134.

Referring to FIG. 3a to FIG. 3e, the foregoing in relation to the low frequency adjustment module 125d of FIG. 2a and FIG. 2c is further discussed via an example of a fundamental bass frequency signal which can be included in the second bass portion.

Figure 3A:
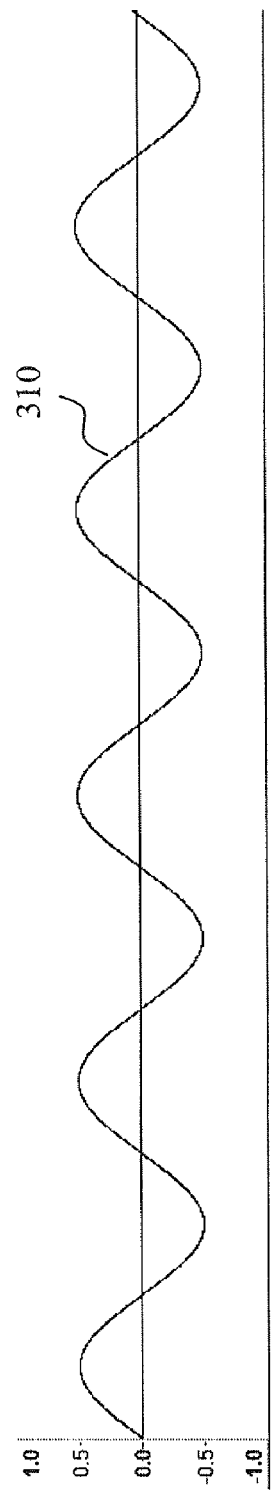
FIG. 3a to FIG. 3e illustrate an example of signal processing of a fundamental bass frequency signal via the low frequency adjustment module of FIG. 1, according to an embodiment of the disclosure.

As shown in FIG. 3a, the fundamental bass frequency signal is, for example, a 50 Hz sinusoidal signal 310.

Figure 3B:
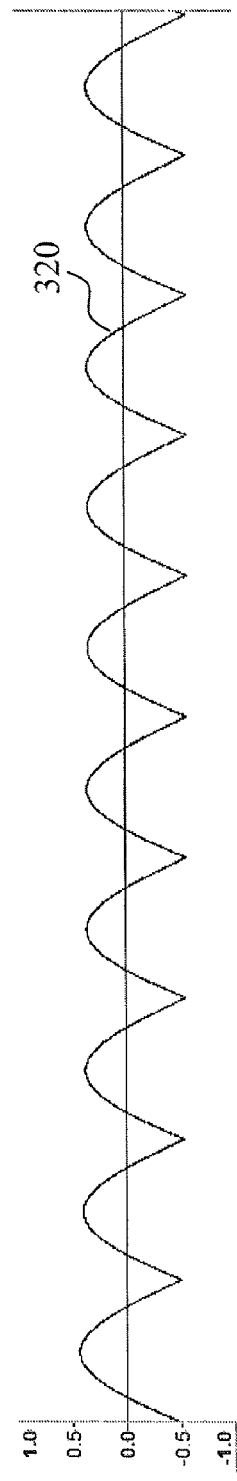

Referring to FIG. 3b, the harmonic generator 125g processes the 50 Hz sinusoidal signal 310 to produce a rectified signal 320 of the 50 Hz sinusoidal signal 310, thereby producing harmonics thereof. As can be noted from FIG. 3b, DC offset for the rectified signal 320 is removed.

The second filter 125h can thus be implemented using a low pass filter having a 141 Hz cutoff frequency and a 24 dB roll off, such that harmonics associated with frequencies below approximately 150 Hz are processed by the shifter 125i. More specifically, the 50 Hz signal can have a harmonic associated with a 100 Hz frequency which can be processed by the shifter 125i whereas receipt, by the shifter 125i, of harmonics of the 50 Hz signal above the harmonic associated with the 100 Hz frequency can be impeded by the second filter 125h. In this regard, harmonics of the 50 Hz signal above the harmonic associated with the 100 Hz frequency can be examples of the aforementioned high order harmonics whereas the harmonic of the 50 Hz signal associated with the 100 Hz frequency can be an example of the aforementioned low order harmonics.

Figure 3C:
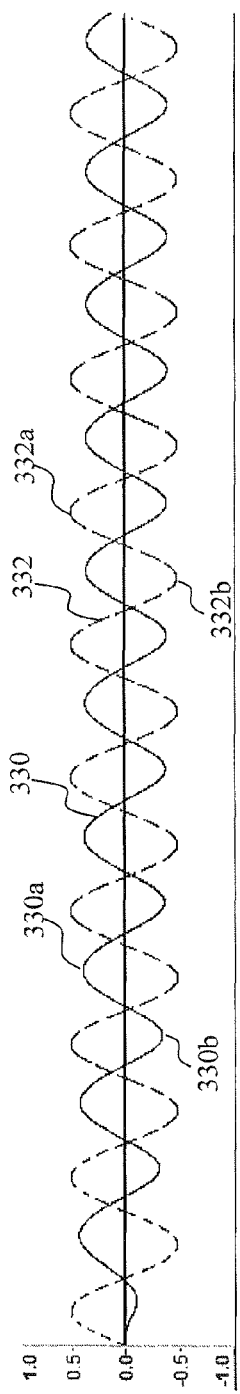

FIG. 3c illustrates a filter processed signal 330 at the second filter 125h output. The filter processed signal 330 is compared with a bass frequency audio signal 332 associated with the first bass portion received by an input of the sub-channel combiner module 126 via the first splitter output 125e of the splitter 125c.

The filter processed signal 330 includes peaks 330a and troughs 330b, and the bass frequency audio signal 332 includes peaks 332a and troughs 332b. The peaks 330a/332a and the troughs 330b/332b are respectively indicative of positive amplitude and negative amplitude of the respective filter processed and bass frequency audio signals 330/332.

As can be observed in FIG. 3c, the filter processed signal 330 and the bass frequency audio signal 332 are out of phase. More specifically, the peaks 332a and troughs 332b of the bass frequency audio signal 332 coincide, respectively, with the troughs 330b and the peaks 330a of the filter processed signal 330. Thus, destructive interference between the filter processed signal 330 and the bass frequency audio signal 332 may occur in a manner in which positive and negative amplitudes of each of the filter processed and bass frequency audio signals 330/332 are reduced.

In one example, a peak 330a of the filter processed signal 330 may coincide with a trough 332b of the bass frequency audio signal 332. Thus the positive amplitude of the filter processed signal 330 may be reduced by a magnitude corresponding to, for example, the negative amplitude of the bass frequency audio signal 332.

In another example, a trough 330b of the filter processed signal 330 may coincide with a peak 332a of the bass frequency audio signal 332. Thus positive amplitude of the bass frequency audio signal 332 may be reduced by a magnitude corresponding to, for example, the negative amplitude of the filter processed signal 330.

The filter processed signal 330 corresponds to the harmonics, associated with the 50 Hz sinusoidal signal 310. The bass frequency audio signal 332 is, for example, a 100 Hz signal. Thus, if harmonics of the 50 Hz sinusoidal signal 310 destructively interferes with the 100 Hz bass frequency signal, fidelity of the 100 Hz bass frequency signal may be adversely compromised although power associated with harmonics of the 50 Hz sinusoidal signal 310 is harnessed.

Figure 3D:
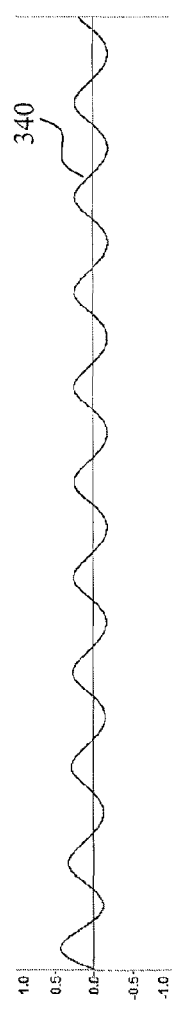

FIG. 3d illustrates an example of a reduced signal 340 due to an effect of the aforementioned destructive interference, wherein the positive and negative amplitudes of the bass frequency audio signal 332 are reduced, as compared to the bass frequency audio signal 332 illustrated in FIG. 3c, due to destructive interference by harmonics of the filter processed signal 330.

Thus by, for example, time shifting the generated harmonics of the filter processed signal 330 via the shifter 125i, as discussed earlier with respect to FIG. 2a and FIG. 2c, such that there is a time delay between harmonics of the filter processed signal 330 and the bass frequency audio signals associated with the first bass portion, the effect of destructive interference illustrated in FIG. 3d can be mitigated.

In one embodiment, the generated harmonics of the filter processed signal 330 are shifted by the shifter 125i such that the peaks 330a and troughs 330b of the filter processed signal 330 do not destructively interfere with the peaks 332a and troughs 332b of the bass frequency audio signal 332.

In another embodiment, the generated harmonics of the filter processed signal 330 are shifted by the shifter 125i such that the positive and negative amplitudes of the bass frequency audio signal 332 are increased by a magnitude corresponding to a portion of the respective positive and negative amplitudes of the filter processed signal 330.

In yet another embodiment, the generated harmonics of the filter processed signal 330 are shifted by the shifter 125i such that the positive and negative amplitudes of the bass frequency audio signal 332 are increased by a magnitude corresponding to magnitude of the respective positive and negative amplitudes of the filter processed signal 330.

Figure 3E:
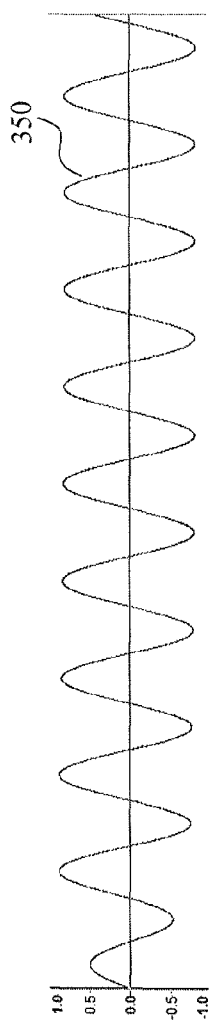

FIG. 3e shows an example of an amplified signal 350 wherein the positive and negative amplitudes of the bass frequency audio signal 332 are increased, as compared to the bass frequency audio signal 332 of FIG. 3c, by a magnitude corresponding to the positive and negative amplitudes of the filter processed signal 330 of FIG. 3c.

Thus, as illustrated by FIG. 3a to FIG. 3e via the filter processed signal 330 and the bass frequency signal 332, the low frequency adjustment module 125d facilitates preservation of fidelity of bass frequency audio signals while harnessing power associated with the fundamental bass frequency signal.

Moreover, the low frequency adjustment module 125*d* facilitates amplification of bass frequency audio signals, as illustrated by the amplified signal 350 of FIG. 3*e*. Thus additional gain circuitries or components to compensate the limitation in sensitivity of the human ear at bass audio frequencies are not required.

Figure 4:
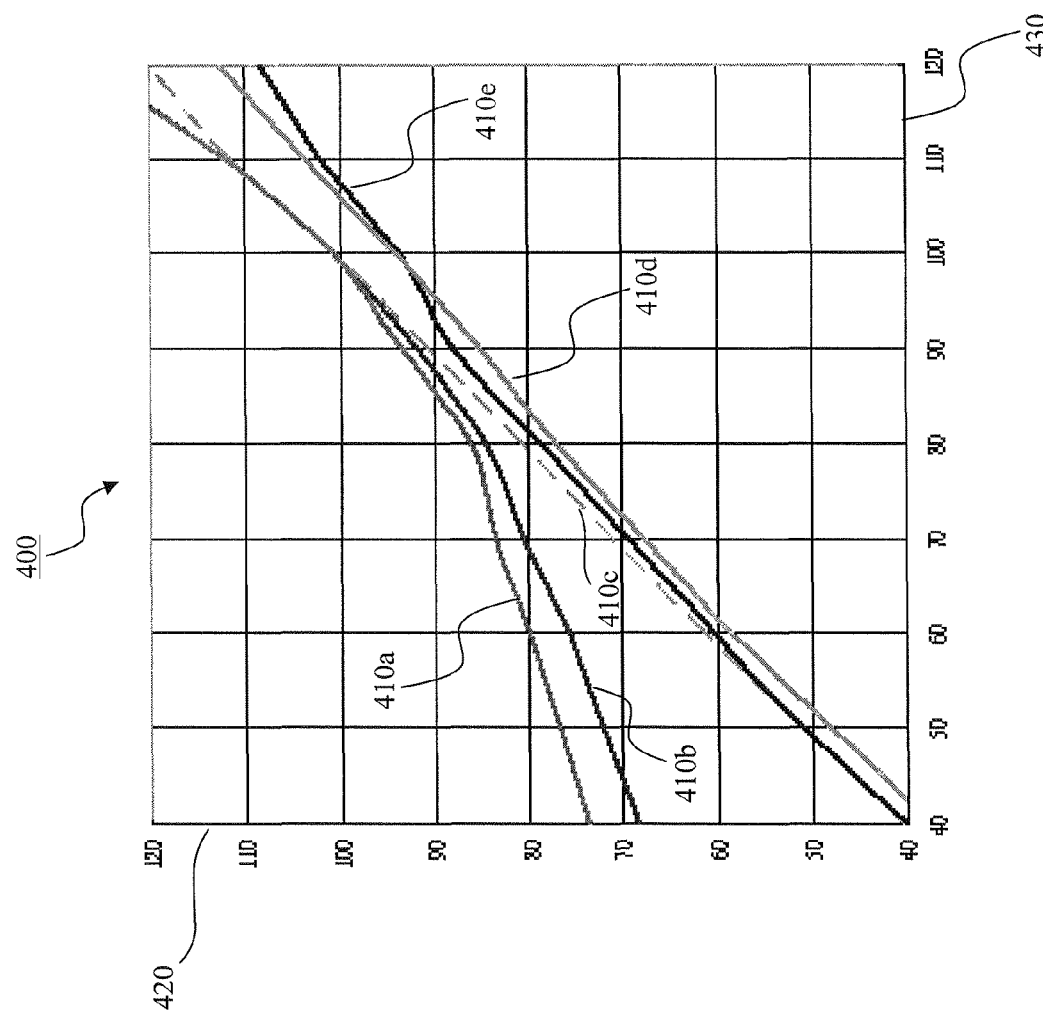
FIG. 4 shows a loudness Dynamic Range Compressor (DRC) graph, which includes a first to a fifth loudness DRC curve, via which DRC settings of a first to a third DRC can be derived, according to an embodiment of the disclosure.
Figure 5:
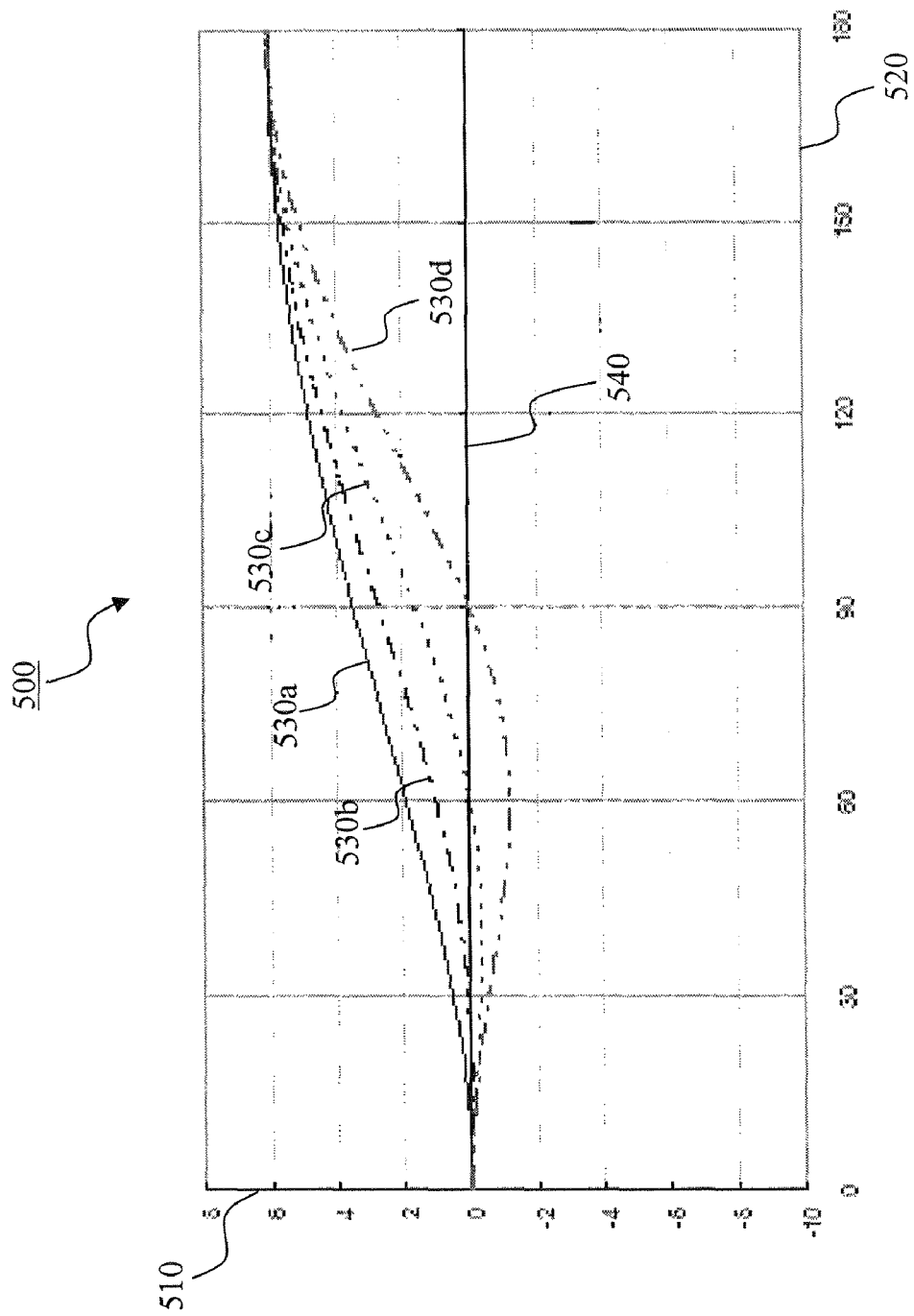
FIG. 5 shows a soundstage graph having a first to a fourth DRC setting curve via which DRC setting of a fourth DRC can be derived, according to an embodiment of the disclosure.

The first to fourth DRCs 125*b*/127*c*/128*c*/129*c* can be configured in accordance with DRC settings which can be derived based on a loudness DRC graph 400 and a soundstage graph 500 as shown in FIG. 4 and FIG. 5 respectively. More specifically, the DRC settings associated with the first to third DRCs 125*b*/127*c*/128*c* can be derived based on the loudness DRC graph 400 as shown in FIG. 4 and the DRC setting associated with the fourth DRC 129*c* can be derived based on the soundstage graph 500 as shown in FIG. 5.

Referring to FIG. 4, the loudness DRC graph 400, which can be based on international standards for equal-loudness level contours (ISO 226: 2003), is shown. The loudness DRC graph 400 includes a first loudness DRC curve 410*a*, a second loudness DRC curve 410*b*, a third loudness DRC curve 410*c*, a fourth loudness DRC curve 410*d* and a fifth loudness DRC curve 410*e*. Each of the first to fifth loudness DRC curves 410*a* to 410*e* corresponds to a frequency, measured in hertz (Hz), within the range of, for example, 50 Hz to 10 KHz. For example, the first to fifth loudness DRC curves 410*a* to 410*e* correspond to frequencies of 50 Hz, 70 Hz, 1 KHz, 3 KHz and 10 KHz respectively.

The loudness DRC graph 400 further includes a sound pressure axis 420 which measures sound pressure level in dB SPL and a loudness axis 430 which measures loudness level in phons.

The loudness DRC graph 400 can be used to derive DRC settings associated with the first to third DRCs 125*b*/127*c*/128*c*, as will be discussed later in greater detail with reference to FIG. 6.

Referring to FIG. 5, a soundstage graph 500 is shown. The soundstage graph can be based on various scenarios such as the exemplary scenario 141 mentioned in FIG. 1*b*. More specifically, the soundstage graph 500 can be associated with the aforementioned the out-of-phase processed sub-signals (symbolized as "sub 2" in equation 4).

The soundstage graph 500 includes a gain axis 510 and a phase axis 520. The gain axis 510 can be indicative of gain of the second channel signal received at each of the first and second combiners 132*a*/132*b* of the output portion 134. The phase axis 520 can be indicative of the phase difference between the left output and right output signals received at the respective first and second output ports 134*a*/134*b* of the output portion 134.

More specifically, the gain axis 510 can be associated with the multiplication factor, symbolized as "K2", in equation 4 whereas the phase axis 520 can be associated with the predetermined right and left recording angles 140*a*/140*b*.

The soundstage graph 500 also includes a first DRC setting curve 530*a*, a second DRC setting curve 530*b*, a third DRC setting curve 530*c* and a fourth DRC setting curve 530*d*. The soundstage graph 500 further includes an original sound stage indication axis 540. The original sound stage indication axis 540 corresponds to the earlier mentioned tonality of soundstage.

The soundstage graph 500 can be used to derive DRC setting in association with the fourth DRC 129*c*. For example, each of the first to fourth DRC setting curves 530*a* to 530*d* corresponds to an expansion ratio for the DRC setting in association with the fourth DRC 129*c*. More specifically, for example, the first to fourth DRC setting curves 530*a*/530*b*/530*c*/530*d* correspond to expansion ratios of 1:1, 1.2:1, 1.5:1 and 2:1, respectively.

As mentioned earlier, based on loudness DRC graph 400 and the soundstage graph 500, DRC settings associated with the first to fourth DRCs 125*b*/127*c*/128*c*/129*c* can be derived. DRC settings associated with the first to fourth DRCs 125*b*/127*c*/128*c*/129*c* will be discussed in greater detail hereinafter with reference to FIG. 6.

Figure 6:
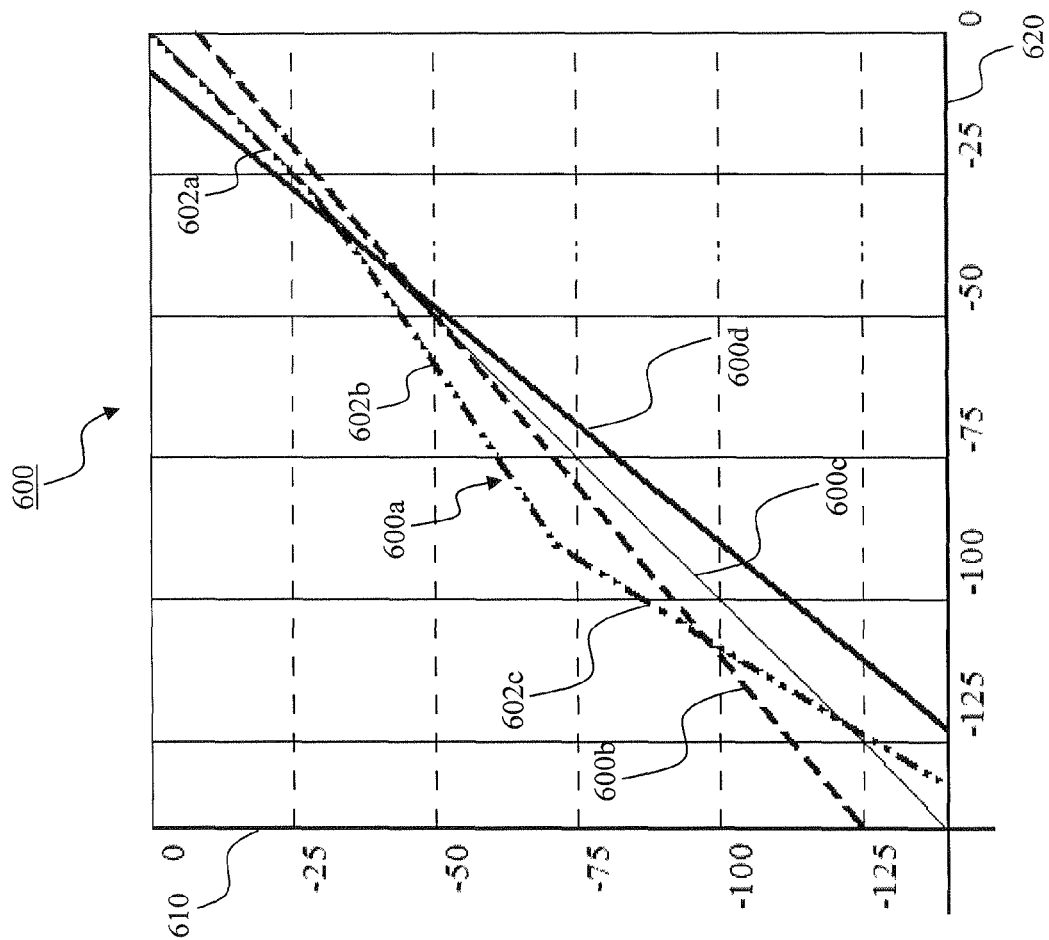
FIG. 6 shows a DRC setting graph which includes a first to a fourth DRC setting plot corresponding, respectively, to the first and the fourth DRCs mentioned in FIG. 4 and FIG. 5, according to an embodiment of the disclosure.

FIG. 6 illustrates a DRC setting graph 600 in which a first DRC setting plot 600*a*, a second DRC setting plot 600*b*, a third DRC setting plot 600*c* and a fourth DRC setting plot 600*d* are shown. The first DRC setting plot 600*a* includes a first setting portion 602*a*, a second setting portion 602*b* and a third setting portion 602*c*. The DRC setting graph 600 includes an input axis 610 which is indicative of magnitude of an audio signal input and an output axis 620 which is indicative of magnitude of an audio signal output. Both the audio signal input and output are measured in decibels (dB).

The first to fourth DRC setting plots 600*a*/600*b*/600*c*/600*d* correspond to the first to fourth DRCs 125*b*/127*c*/128*c*/129*c* respectively. Each of the first to fourth DRC setting plots 600*a*/600*b*/600*c*/600*d* is indicative of DRC setting for each corresponding first to fourth DRCs 125*b*/127*c*/128*c*/129*c*.

Thus the input and output axes 610/620 of the DRC setting graph 600 generally relate to magnitudes of audio signals at, respectively, the input and output of the first to fourth DRCs 125*b*/127*c*/128*c*/129*c*.

In one example, magnitude of an audio signal input indicated by the input axis 610 and magnitude of an audio signal output indicated by the output axis 620, with respect to the first DRC setting plot 600*a*, correspond to, respectively, magnitude of a bass frequency audio signal at the input of the first DRC 125*b* and magnitude of a processed bass frequency audio signal at the output of the first DRC 125*b*.

In a further example, with respect to the fourth DRC setting plot 600*d*, magnitude of an audio signal input indicated by the input axis 610 and magnitude of an audio signal output indicated by the output axis 620 correspond, respectively, to magnitude of the aforementioned phase shifted audio frequency signals at the input of the fourth DRC 129*b* and magnitude of the aforementioned second channel signal at the output of the fourth DRC 129*b*.

The above discussion pertaining to the input and output axes 610/620 of the DRC setting graph 600, with respect to the first and fourth DRC setting plots 600*a*/600*d*, applies analogously to each of the second and third DRC setting plots 600*b*/600*c*.

The DRC setting corresponding to each of the first to fourth DRCs 125*b*/127*c*/128*c*/129*c* can include at least one of expansion ratio, compression ratio and linear ratio. The linear ratio, expansion ratio and compression ratio correspond, respectively, to linear dynamic range processing, manipulation of dynamic range via expansion and manipulation of dynamic range via compression, as discussed earlier with respect to FIG. 2*a* to FIG. 2*d*.

The first to third DRC setting plots 600*a* to 600*c* are based on the loudness DRC graph 400 of FIG. 4. The fourth DRC setting plot 600*d* is based on the soundstage graph 500 of FIG. 5.

Taking reference to the first to fifth loudness DRC curves 410*a* to 410*e* of FIG. 4 at various frequencies, the DRC setting for each of the first to third DRCs 125*b*/127*c*/128*c* corresponding to the aforementioned various frequencies can be derived.

For example, the first DRC setting plot 600a corresponding to the first DRC 125b, which is associated to processing of bass audio frequency signals in the low frequency processing portion 125 of the processing apparatus 120, can be derived by taking reference to loudness DRC curves which are associated with bass audio frequency signals. Such DRC loudness curves include the first and second loudness DRC curves 410a/410b, of FIG. 4, which are associated with bass frequencies of 50 Hz and 70 Hz respectively.

The above example of the first DRC setting plot 600a corresponding to the first DRC 125b analogously applies to the second and third DRC setting plots 600b/600c corresponding to the second and third DRCs 127c/128c respectively.

Referring to the first DRC setting plot 600a, the first setting portion 602a is a high level input portion in which magnitude of an audio signal input ranges approximately from, for example, −25 dB to 0 dB. The second setting portion 602b is a mid-level input portion in which magnitude of an audio signal input ranges approximately from, for example, more than −90 dB to less than −25 dB. The third setting portion 602c is a low level input portion in which magnitude of an audio signal input ranges approximately from, for example, more than −130 dB to less than −90 dB. The third setting portion 602c can correspond to the aforementioned bass audio frequency signals associated with low level magnitudes as discussed with reference to FIG. 2a and FIG. 2c.

Thus, at the first setting portion 602a, neither manipulation of dynamic range via compression nor manipulation of dynamic range via expansion may be required. Therefore it is possible to configure the first DRC 125b to have a DRC setting corresponding to a linear ratio at the first setting portion 602a.

Additionally, it may be desired to manipulate dynamic range such that difference between magnitudes of audio signals at the input and output of the first DRC 125b is lesser at the second setting portion 602b, as compared to that of the third setting portion 602c. In this respect, dynamic range of the third setting portion 602c is higher than dynamic range of the second setting portion 602b.

More specifically manipulation of dynamic range via compression and manipulation of dynamic range via expansion may be desired at the second setting portion 602b and the third setting portion 602c, respectively. Therefore it is possible to configure the first DRC 125b to have a DRC setting corresponding to a compression ratio and an expansion ratio at the second and third setting portions 602b/602c, respectively.

By configuring the first DRC 125b in a manner such that the third setting portion 602c has a higher dynamic range compared to the second setting portion 602b, bass audio frequency signals at the low level input portion can be processed to produce processed bass audio frequency signals which can be distinguished from the aforementioned noise signals associated with system noise floor. Thus mitigating poor noise performance due to noise signals associated with system noise floor.

In one example, the first DRC 125b can be configured, with reference to a sound pressure threshold of 85 to 90 dB SPL per meter, based on the first and second loudness DRC curves 410a/410b of FIG. 4. The DRC setting of the first DRC 125b includes a linear ratio of 1:1 and a compression ratio between 1.2:1 and 2:1. The DRC setting of the first DRC 125b further includes an expansion ratio which is substantially similar to that of the fourth DRC setting plot 600d. The fourth DRC setting plot 600d will be discussed later in greater detail.

Referring to the second DRC setting plot 600b, the second DRC 127c can be configured to manipulate dynamic range via compression.

In one example, the second DRC 127c can be configured, with reference to a sound pressure threshold of 80 to 85 90 dB SPL per meter, based on the fourth and fifth loudness DRC curves 410d/410e of FIG. 4. The DRC setting of the second DRC 127c includes a compression ratio of 1.2:1.

Referring to the third DRC setting plot 600c, the third DRC 128c can be configured for linear dynamic range processing. Thus the DRC setting of the third DRC 128c includes a linear ratio of 1:1.

As mentioned earlier, the fourth DRC setting plot 600d is based on the soundstage graph 500 of FIG. 5. Hence, taking reference to the first to fourth DRC setting curves 530a to 530d of FIG. 5, the DRC setting, in association with the fourth DRC setting plot 600d, for the fourth DRC 129c can be derived as will be discussed hereinafter.

As discussed with reference to FIG. 2a and FIG. 2d, the fourth DRC 129c can be configured to mitigate the effect wherein tonality of soundstage is compromised whilst providing wide stereo effect to the stereo audio output.

Further discussed with reference to FIG. 2a and FIG. 2d, soundstage can generally be associated with considerations such as sense of width, depth and height of the stereo audio output as experienced by a user when listening to the stereo audio output of the system 100. Thus considerations associated with soundstage can include considerations related to the predetermined right and left recording angles 140a/140b.

Thus referring to the soundstage graph 500, the gain indicated at the gain axis 510 with respect to a phase difference within a range of 60 to 120 degrees, indicated at the phase axis 520, is representative of wide stereo effect performance of the system 100.

Extent to which original recordings, by the recording device 140, of the location associated with left and right channel audio signals is faithfully reproduced, is indicated by the difference in gain, indicated at the gain axis 510, between the phase difference of 30 degrees indicated at the phase axis 520 and the original soundstage axis 540.

More specifically, taking reference to a phase difference of, for example, 90 degrees at the phase axis 510, the gain indicated at the gain axis 510 with reference thereto should ideally be as high as possible in respect of ideal wide stereo effect performance of the system 100. The difference in gain, indicated at the gain axis 510, between the phase difference of 30 degrees indicated at the phase axis 520 and the original soundstage axis 540 should ideally be as low as possible to indicate faithful reproduction of original recordings by the recording device 140. Thus tonality of soundstage is considered to be substantially preserved when difference in gain between the phase difference of 30 degrees indicated at the phase axis 520 and the original soundstage axis 540 approaches a null value.

Referring again to the soundstage graph 500, the first DRC setting curve 530a, in comparison with the second to fourth DRC setting curves 530b/530c/530d, provides the highest gain, indicated at the gain axis 510, with respect to the phase difference of 90 degrees indicated at the phase axis 520. In this regard, the first DRC setting curve 530a, corresponding to an expansion ratio of 1:1, is ideal in respect of ideal wide stereo effect performance of the system 100.

However, the gain difference between the phase difference of 30 degrees indicated at the phase axis 520 and the original soundstage axis 540 of the first DRC setting curve 530a, in comparison with the second to fourth DRC setting curves 530b/530c/530d, is also the highest.

Thus although ideal wide stereo effect performance of the system 100 can be achieved by configuring the fourth DRC 129c in accordance with the first DRC setting curve 530a, it can be appreciated that tonality of soundstage is compromised.

Referring yet again to the soundstage graph 500, the second DRC setting curve 530b, in comparison with the first, third and fourth DRC setting curves 530a/530c/530d, provides the smallest gain difference between the phase difference of 30 degrees indicated at the phase axis 520 and the original soundstage axis 540.

Additionally, it is also notable that, for the second DRC setting curve 530b, the gain indicated at the gain axis 510 with respect to the phase difference of 90 degrees indicated at the phase axis 520, is comparable with respect to that of the first DRC setting curve 530a.

Thus by configuring the fourth DRC 129c in accordance with the second DRC setting curve 530b, corresponding to an expansion ratio of 1.2:1, wide stereo effect to the stereo audio output can be provided without substantially compromising tonality of soundstage.

Therefore, the fourth DRC setting plot 600d, as illustrated in FIG. 6, can correspond to the expansion ratio of 1.2:1, in accordance with the second DRC setting curve 530b. Thus, based on the fourth DRC setting plot 600d, the fourth DRC 129c can be configured to manipulate dynamic range via expansion corresponding to an expansion ratio of 1.2:1.

Figure 7:
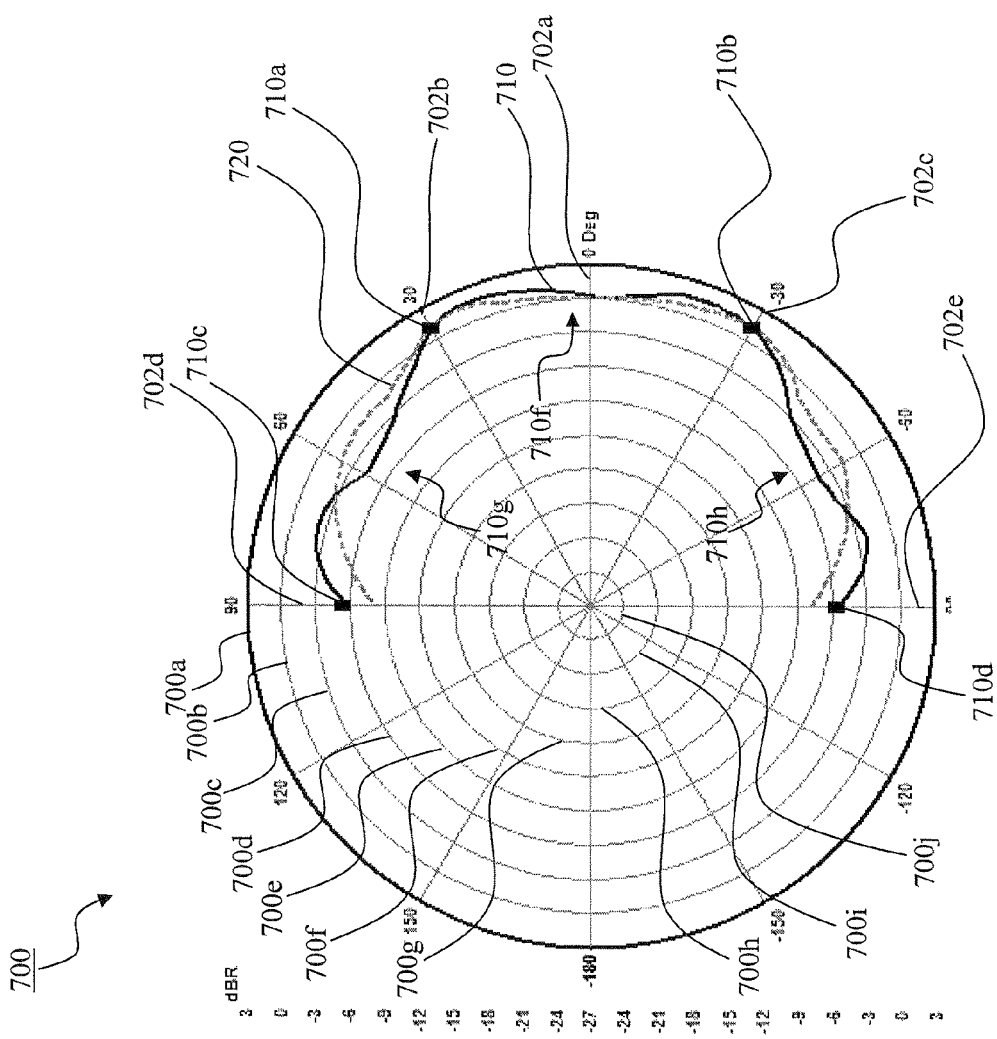
FIG. 7 shows a polar plot in association with the DRC setting of the fourth DRC of FIG. 5.
Figure 8:
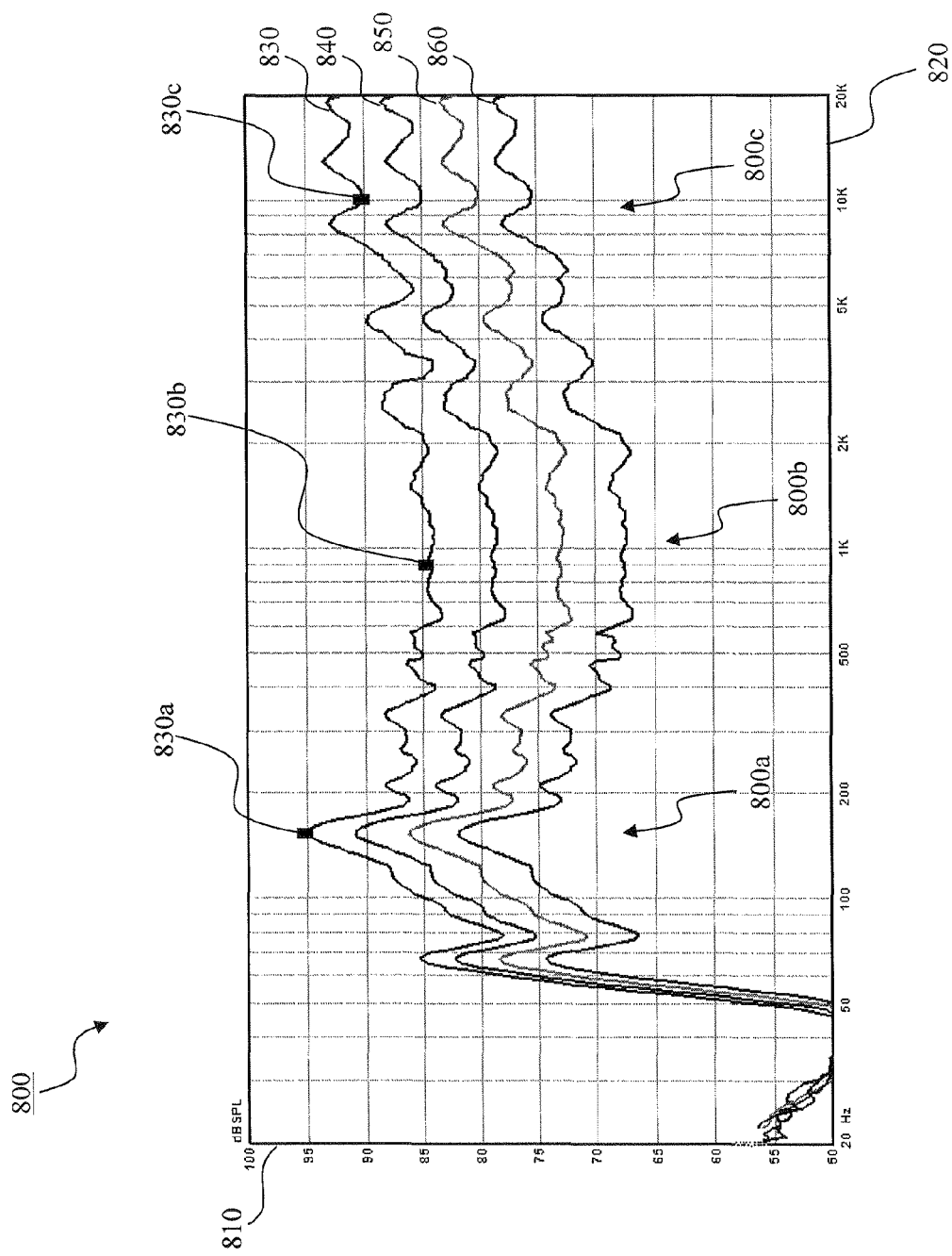

A graphical representation in association with each of the DRC setting of the fourth DRC 129c and the DRC settings of the first to third DRC 125b/127c/128c is provided as shown in FIG. 7 and FIG. 8 respectively.

Referring to FIG. 7, a polar plot 700 in association with the DRC setting of the fourth DRC 129c is shown. The polar plot 700 can be based on the exemplary scenario 141 of FIG. 1b and the soundstage graph 500 of FIG. 5.

The polar plot 700 illustrates, with respect to various audio frequencies, input/output ratio in conjunction with tonality of soundstage. The input/output ratio can be a measure of ratio of magnitudes of the right and left channel audio signals, received by the audio source input portion 112, with respect to magnitudes of the right and left output signals respectively, received at the output portion 134.

The polar plot 700 includes a plurality of concentric axis, each of which corresponds to an input/output ratio measured in dB(relative) (dBR). More specifically, the polar plot 700 includes a first to tenth concentric axis 700a to 700j, each of which corresponds to an input/output ratio ranging between 3 dBR to −27 dBR. For example, the second concentric axis 700b corresponds to an input/output ratio of 0 dBR and the fifth concentric axis 700e corresponds to an input/output ratio of −9 dBR.

The polar plot 700 also includes a plurality of tonality axis corresponding to the tonality of soundstage. A tonality axis within the plurality of tonality axis can correspond to, for example, the recording incident axis 142, the predetermined right recording angle 140a or the predetermined left recording angle 140b. More specifically, the polar plot 700 includes a first tonality axis 702a, associable with an angle of 0 degrees, corresponding to the recording incident axis 142. The polar plot 700 further includes a second tonality axis 702b, associable with an angle of 30 degrees, and a third tonality axis 702c, associable with an angle of −30 degrees. The second and third tonality axes 702b/702c correspond to the predetermined right and left recording angles 140a/140b, respectively, each of which having a predetermined angle of 30 degrees. The polar plot 700 can further include a fourth tonality axis 702d and a fifth tonality axis 702e.

As noted in the polar plot 700, the second and third tonality axes 702b/702c are associable with an angle of 30 degrees and an angle of −30 degrees respectively. The difference in polarity of the angles is indicative of the relative positioning of the second and third tonality axes 702b/702c with respect to the first tonality axis 702a.

The polar plot 700 further includes a first polar curve 710 corresponding to a first audio frequency and a second polar curve 720 corresponding to a second audio frequency. The first audio frequency is, for example, a 4 KHz sinusoidal wave and the second audio frequency is, for example, an 8 KHz sinusoidal wave.

As shown, input/output ratio in conjunction with tonality of soundstage is illustrated with respect to the first and second polar curves 710/720.

As earlier mentioned, the input/output ratio can be a measure of ratio of magnitudes of right and left channel audio signals, received by the audio source input portion 112, with respect to magnitudes of right and left output signals respectively, received at the output portion 134.

Thus, the ratio of the magnitude of the right channel audio signal and the magnitude of the right output signal can be the input/output ratio corresponding to the second tonality axis 702b. The ratio of the magnitude of the left channel audio signal and the magnitude of the left output signal can be the input/output ratio corresponding to the third tonality axis 702c.

The input/output ratio provides an indication of performance of the system 100 in association with directivity of the stereo audio output at the output portion 134.

The first and second polar curves 710/720 correspond to response, in terms of directivity of the stereo audio output of the system 100, of 4 KHz/8 KHz audio signals at the output portion 134 when the fourth DRC 129c is configured in accordance with the second DRC setting curve 530b.

The response will be described in further detail hereinafter with respect to the first polar curve 710. As the responses for both of the first and second polar curves 710/720 are substantially similar, the following discussion with respect to the first polar curve 710 applies analogously to the second polar curve 720.

As shown, the first polar curve 710 intersects the second and third tonality axes 702b/702c at a first intersection point 710a and at a second intersection point 710b respectively. The first polar curve 710 further intersects the fourth and fifth tonality axes 702d/702e at a third intersection point 710c and a fourth intersection point 710d respectively.

Further shown, the first and second intersection points 710a/710b define a first input/output range 710f. The first and third intersection points 710a/710c define a second input/output range 710g. The second and fourth intersection points 710b/710d define a third input/output range 710h. The input/output ratios within the first input/output range 710f are higher in comparison with the input/output ratios within either the second input/output range 710g or the third input/output range 710h.

For example, an input/output ratio within the first input/output range 710f may range substantially between 0 to 3 dBR whereas within the second input/output range 710g, approaching the third intersection point 710c, an input/output ratio may range substantially between −9 to 0 dBR.

Thus input/output ratios within the first input/output range 710f indicate better directivity of the stereo audio output of the system 100 at the output portion 134 compared to that of input/output ratios within either the second or third input/output ranges 710g/710h.

Therefore, when the fourth DRC 129c is configured in accordance with the second DRC setting curve 530b, corresponding to an expansion ratio of 1.2:1, performance of the system 100 in association with directivity can be improved.

Referring to FIG. 8, an output graph 800 depicting frequency response at the output module 130 of the system 100 is shown. More particularly, the output graph 800 depicts frequency response in association with the left output signal received at the first output port 134a of the output portion 134.

The output graph 800 can generally be segmented into a first frequency response portion 800a, a second frequency response portion 800b and a third frequency response portion 800c. Furthermore, the output graph 800 includes an output level axis 810 indicating output sound pressure level (SPL) measured in dBSPL and a frequency axis 820 indicating output audio frequency measured in Hz or KHz.

An output audio frequency indicated at the frequency axis 820 corresponds to a frequency in association with the left output signal received at the first output port 134a of the output portion 134. Additionally, an output SPL indicated at the output level axis 810 corresponds to a magnitude in association with the left output signal received at the first output port 134a of the output portion 134.

Frequency response in association with the left output signal received at the first output port 134a of the output portion 134 can be depicted in the output graph 800 via a first response curve 830, a second response curve 840, a third response curve 850 and a fourth response curve 860. In general, the frequency responses depicted by the first to fourth response curves 830/840/850/860 are similar, and differ only in respect to the output SPL, with respect to each other.

The first to fourth response curves 830/840/850/860 can be based on, for example, the reference gain level associated with the audio source earlier mentioned in FIG. 1a. The differences in the output SPLs of the first to fourth response curves 830/840/850/860 correspond to, for example, the corresponding reference gain levels based on corresponding adjustments of the adjustable gain using the adjustable gain module of the audio source. For example, the first response curve 830 corresponds to a higher reference gain level compared to any of the second to fourth response curves 840/850/860. The fourth response curve 860 corresponds to a lower reference gain level compared to any of the first to third response curves 830/840/850.

In this regard, the output graph 800 will be discussed hereinafter with respect to the first response curve 830. It is understood that the discussion with respect to the first response curve 830 applies analogously to the second to fourth response curves 840/850/860.

As mentioned earlier, the output graph 800 can generally be segmented into a first, a second and a third frequency response portion 800a/800b/800c. Thus the first response curve 830 can similarly be segmented according to the first, second and third frequency response portions 800a/800b/800c. The first response curve 830 includes a first response point 830a, a second response point 830b and a third response point 830c.

As shown, the first frequency response portion 800a can be a low frequency response portion having a frequency range which includes output audio frequencies of 100 Hz to 200 Hz. The second response portion 800b can be a mid range frequency response portion having a frequency range which includes output audio frequencies of 500 Hz to 2 KHz. The third response portion 800c can be a high frequency response portion having a frequency range which includes output audio frequencies of 5 KHz to 20 KHz. The first, second and third response points 830a/830b/830c can each correspond to an output audio frequency within the first, second and third response portions 800a/800b/800c, respectively. For example, the first response point 830a corresponds to a 160 Hz output audio frequency, the second response point 830b corresponds to a 900 Hz output audio frequency and the third respond point 830c corresponds to a 10 KHz output audio frequency.

As can be observed from the output graph 800, the output SPLs associated with first and third response portions 800a/800c are notably higher compared to that of the second response portion 800b. Particularly, the first response point 830a and the third response point 830c correspond, respectively, to output SPLs of 95 and 90 dBSPL whereas the second response point 830b corresponds an output SPL of less than 85 dBSPL. Thus the output SPL associated with each of the first and third response points 830a/830c is higher compared to that of the second response point 830b.

Thus, with the first, second and third DRCs 125b/127c/128c configured in the aforementioned manner as discussed with reference to FIG. 2a and FIG. 2c, the output SPLs associated with the first and third response portions 800a/800c can be notably higher as compared to that of the second response portion 800b. Therefore, perceived loudness of the audio frequencies at the extremities of the audio range can be improved, thus compensating limitation in sensitivity of the human ear at the extremities of the audio range.

In view of the foregoing, it can be appreciated that various embodiments of the system 100, which includes the low frequency processing portion 125, is generally capable of facilitating the preservation of fidelity of bass audio frequency signals while harnessing power associated with the fundamental bass frequency signal. Moreover, the low frequency processing portion 125 facilitates amplification of bass audio frequency signals without having to include additional gain circuitries or components to compensate the limitation in sensitivity of the human ear at bass audio frequencies. Additionally, the low frequency processing portion 125 further facilitates the mitigation of poor noise performance due to noise signals associated with system noise floor.

Furthermore, various embodiments of the system 100 which includes the soundstage processing portion 129 is further generally capable of providing wide stereo effect to the stereo audio output without substantially compromising tonality of soundstage. Additionally, the soundstage processing portion 129 facilitates improvement in performance of the system 100 in association with directivity of the stereo audio output at the output portion 134.

Figure 9A:
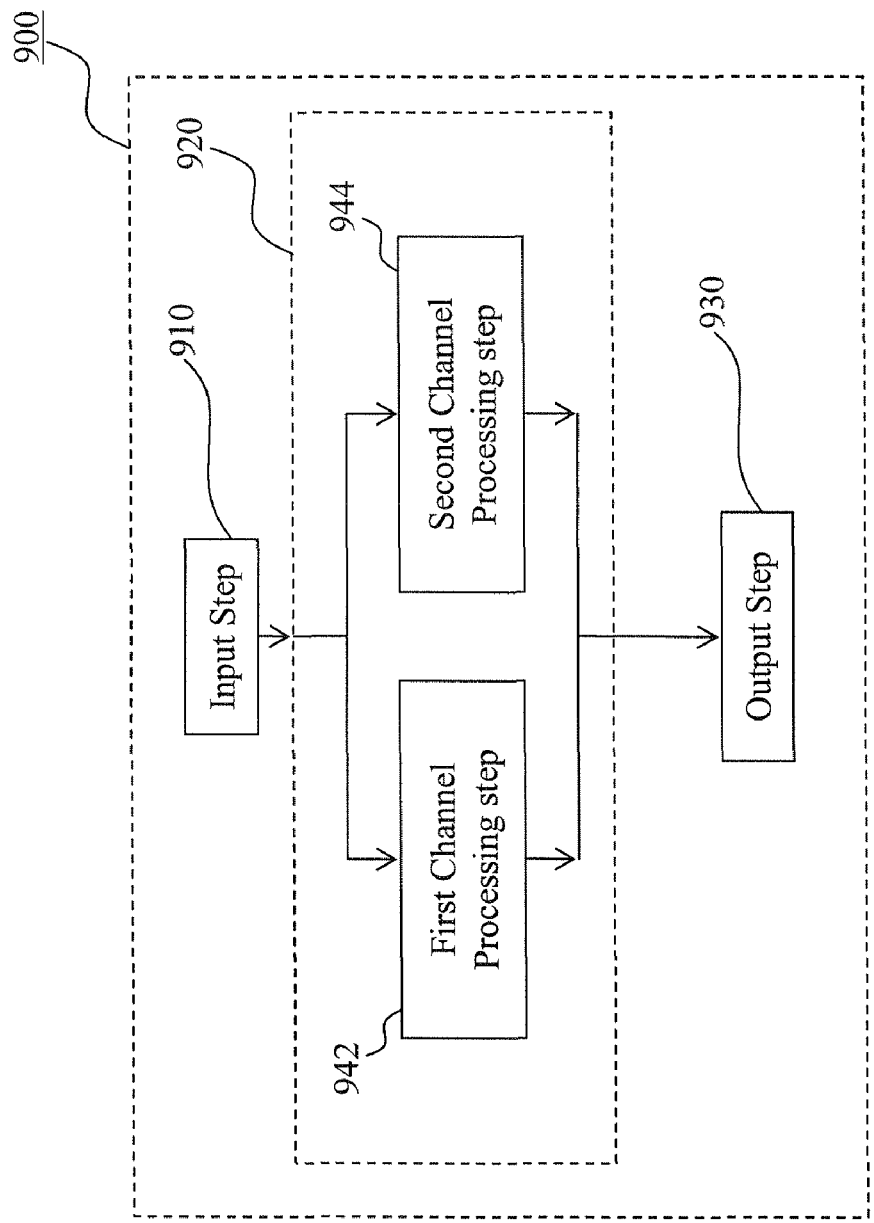
FIG. 9a to FIG. 9c show a processing method implemented in association with the system of FIG. 1, in accordance with another embodiment of the disclosure.
Figure 9B:
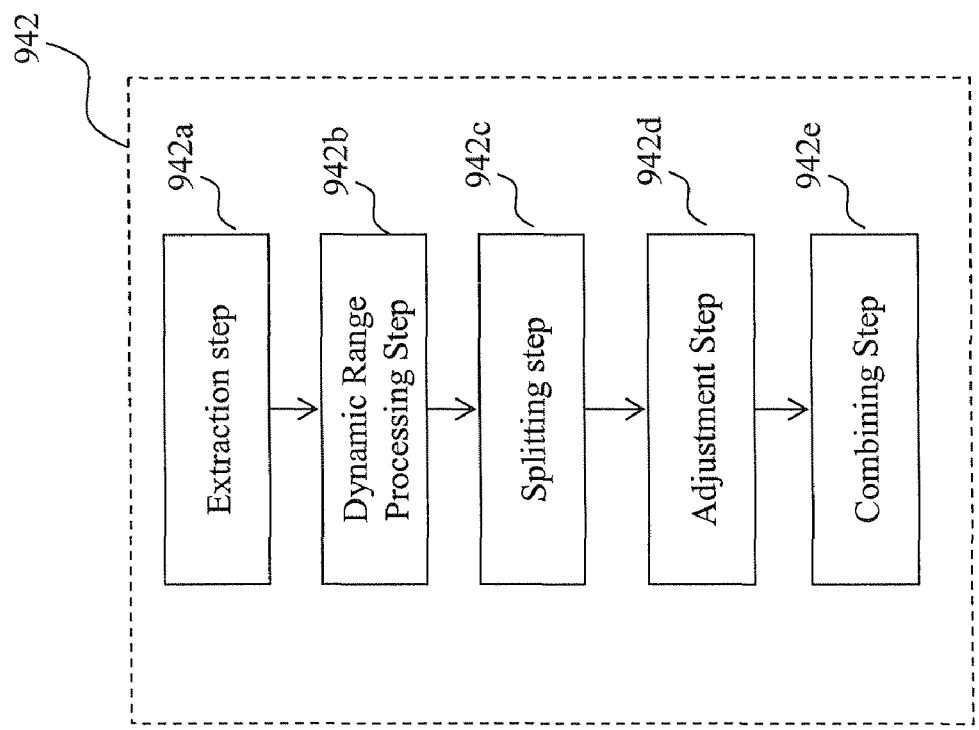
Figure 9C:
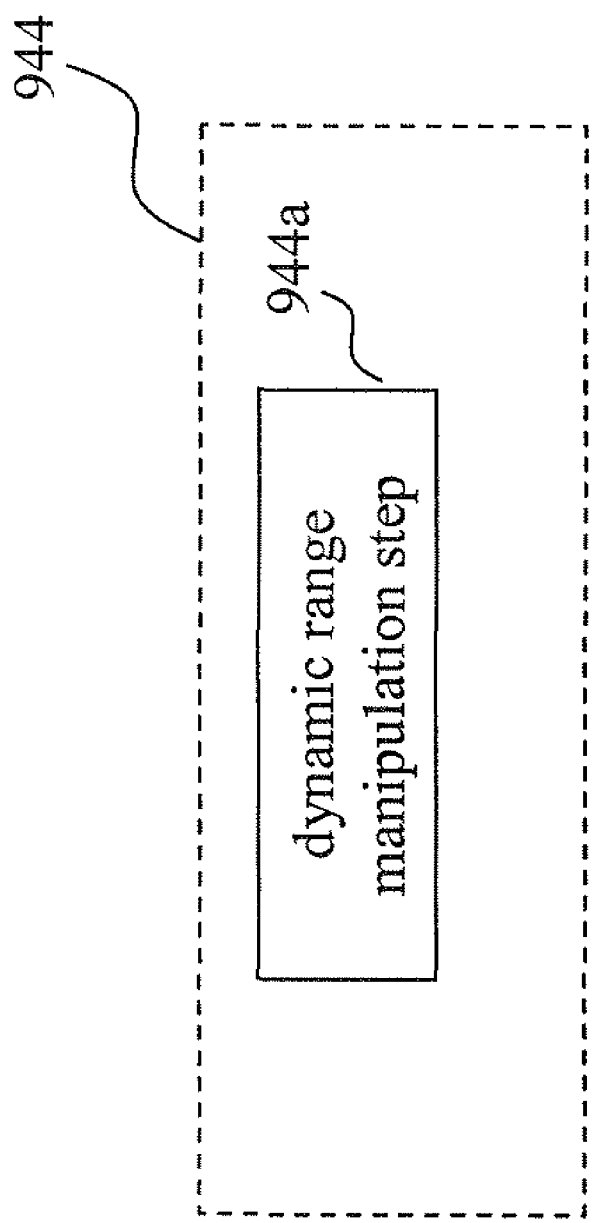

Referring to FIGS. 9a to 9c, a processing method 900, in accordance with another embodiment of the disclosure, is preferably implemented in association with the system 100. FIG. 9a provides an overview of the method 900 which includes an input step 910, a signal processing step 920 and an output step 930. The signal processing step 920 includes at least one of a first channel processing step 942 and a second channel processing step 944. FIG. 9b and FIG. 9c, respectively, illustrate the first and second channel processing steps 942/944 in further detail.

Referring to FIG. 9a, at the input step 910, left and right channel audio signals from an audio source are received at the input module 110. The left and right channel audio signals can be processed at the input module 110 and communicated as one or more input combination signals to the processing apparatus 120, at the signal processing step 920, where they are further processed.

In one embodiment, at the signal processing step 920, the one or more input combination signals can be processed at the first channel processing step 942. In another embodiment, at the signal processing step 920, the one or more input combination signals can be processed at the second channel processing step 944. In yet another embodiment, at the signal processing step 920, the one or more input combination signals can be processed at the first channel processing step 942 and the second channel processing step 944.

At the first channel processing step 942, which will be discussed later in further detail with respect to FIG. 9b, at least one input combination signal can be processed at the first channel processing portion 122 to produce the first channel signal. At the second channel processing step 944, which will be discussed later in further detail with respect to FIG. 9c, at least one input combination signal can be processed at the second channel processing portion 124 to produce the second channel signal.

At the output step 930, either one or both of the first and second channel signals can be communicated to, and received at, the output module 130. The first and second channel signals can thus be further processed to produce the left and right output signals.

Referring to FIG. 9b, the first channel processing step 942 includes an extraction step 942a, a dynamic range processing step 942b, a splitting step 942c, an adjustment step 942d and a combining step 942e.

At the extraction step 942a, bass frequency audio signals can be extracted from the at least one input combination signal via the first filter 125a.

At the dynamic range processing step 942b, the bass frequency audio signals can be processed, by the first DRC 125b, via at least one of linear dynamic range processing, manipulation of dynamic range via compression and manipulation of dynamic range via expansion to produce processed bass frequency audio signals.

At the splitting step 942c, the processed bass frequency audio signals can be processed by the splitter 125c to produce the first bass portion and the second bass portion.

At the adjustment step 942d, the second bass portion can be processed by the low frequency adjustment module 125d to produce the processed second bass portion.

At the combining step 942e, the first bass portion and the processed second bass portion can be processed by the sub-channel combiner 126 to produce a first channel signal.

Referring to FIG. 9c, the second channel processing step 944 includes a dynamic range manipulation step 944a where the at least one input combination signal can be processed by the fourth DRC 129c via manipulation of dynamic range by expansion corresponding to an expansion ratio, thereby producing the second channel signal. The expansion ratio can be an expansion ratio of 1.2:1.

In the foregoing manner, various embodiments of the disclosure are described for addressing at least one of the foregoing disadvantages. Such embodiments are intended to be encompassed by the following claims, and are not to be limited to specific forms or arrangements of parts so described and it will be apparent to one skilled in the art in view of this disclosure that numerous changes and/or modification can be made, which are also intended to be encompassed by the following claims.

The invention claimed is:

1. A processing apparatus suitable for signal communication with a system having at least one of an input module and an output module, the processing apparatus being configurable to receive input signals from the input module of the system, the processing apparatus comprising:
a first channel processing portion to which the input signals are communicable, the first channel processing portion being configurable to receive and process the input signals, the input signals being processed in a manner such that bass frequency audio signals are extracted from the input signals, the bass frequency audio signals being further processed via at least one of linear dynamic range processing, manipulation of dynamic range via compression and manipulation of dynamic range via expansion, the first channel processing portion comprising:
a low frequency processing portion which includes:
a first dynamic range compressor (DRC) which receives and processes the bass frequency audio signals via at least one of linear dynamic range processing, manipulation of dynamic range via compression and manipulation of dynamic range via expansion to produce processed bass frequency audio signals;
a splitter which is coupled to the first DRC and which receives and further processes the processed bass frequency audio signals to produce a first bass portion and a second bass portion; and
a low frequency adjustment module which is coupled to the splitter and which receives and processes the second bass portion to produce a processed second bass portion, and
a sub-channel combiner module coupled to the splitter and the low frequency adjustment module, the sub-channel combiner module receiving and processing the first bass portion and the processed second bass portion to produce a first channel signal,
wherein the first channel signal is communicable to the output module.

2. The processing apparatus of claim 1 further comprising:
a second channel processing portion to which the input signals are communicable, the second channel processing portion being configurable to receive and process the input signals via manipulation of dynamic range by expansion corresponding to an expansion ratio, thereby producing a second channel signal,
wherein the second channel signal is communicable to the output module.

3. The processing apparatus of claim 2 wherein the first channel processing portion further comprises at least one of a high frequency processing portion and a mid-range frequency processing portion, each of the high and mid-range frequency processing portions being configurable to receive and process the input signals, the input signals being processed in a manner such that high audio frequency signals and mid-range audio frequency signals are extracted from the input signals by the high and mid-range frequency processing portions respectively.

4. The processing apparatus of claim 3,
wherein the high frequency processing portion includes a second DRC and the mid-range frequency processing portion includes a third DRC,
wherein the high and mid-range audio frequency signals are received and processed, respectively, by the second and third DRCs to produce, respectively, processed high audio frequency signals and processed mid-range audio frequency signals, and
wherein the second DRC is configured to process the high audio frequency signals via manipulation of dynamic range via compression which corresponds to a compression ratio and the third DRC is configured to process the mid-range audio frequency signals via linear dynamic range processing.

5. The processing apparatus of claim 4 wherein the second DRC is configured to process the high audio frequency signals via manipulation of dynamic range via compression corresponding to a compression ratio of 1.2:1 and the third DRC is configured to process the mid-range audio frequency signals via linear dynamic range processing which corresponds to a linear ratio of 1:1.

6. The processing apparatus of claim 3 wherein the second channel processing portion includes a fourth DRC via which the input signals are processed via manipulation of dynamic range by expansion, thereby substantially preserving tonality of soundstage.

7. The processing apparatus of claim 3, wherein at least one of the processed high frequency audio signals and the processed mid-range frequency audio signals are further receivable by the sub-channel combiner module for processing to produce the first channel signal.

8. The processing apparatus of claim 2,
wherein the second channel processing portion is configured to receive and process the input signals via manipulation of dynamic range by expansion corresponding to an expansion ratio of 1.2:1, and
wherein the first dynamic range compressor (DRC) which receives and processes the bass frequency audio signals via at least one of linear dynamic range processing corresponding to a linear ratio of 1:1, manipulation of dynamic range via compression corresponding to a compression ratio between 1.2:1 and 2:1, and manipulation of dynamic range via expansion corresponding to an expansion ratio of 1.2:1.

9. The processing apparatus of claim 1 wherein the second bass portion includes a fundamental bass frequency signal and the low frequency adjustment module comprises:
a harmonic generator which receives and processes the second bass portion in a manner such that harmonics of the fundamental bass frequency signal are generated, the generated harmonics including high order harmonics and low order harmonics;
a filter coupled to the harmonic generator for processing the generated harmonics such that communication of high order harmonics is impeded; and
a shifter which is coupled to the filter and which is configured to receive and process the low order harmonics in a manner such that there is an offset between the harmonics of the fundamental bass frequency signal and bass frequency audio signals associated with the first bass portion.

10. The processing apparatus of claim 9, wherein the shifter is configured to time shift the low order harmonics and the offset is a time delay.

11. The apparatus of claim 1,
wherein the system is associable with system floor noise to which noise signals are associable, and
wherein bass audio frequency signals associated with low level magnitudes are distinguishable from noise signals when the first DRC is configured to manipulate dynamic range by expansion.

12. The apparatus of claim 1,
wherein the system is associable with system floor noise to which noise signals are associable, and
wherein the low frequency processing portion further includes a low pass filter (LPF) which is coupled to the first DRC, the LPF configurable to at least one of process the input signals such that bass frequency audio signals are extracted from the input signals and substantially filter the noise signals thereby impeding communication thereof to the first DRC.

13. The apparatus of claim 1,
wherein the system is associable with system floor noise to which noise signals are associable,
wherein the low frequency processing portion further includes a low pass filter (LPF) which is coupled to the first DRC, the LPF configurable to at least one of process the input signals such that bass frequency audio signals are extracted from the input signals and substantially filter the noise signals thereby impeding communication thereof to the first DRC, and
wherein bass audio frequency signals associated with low level magnitudes are distinguishable from noise signals when the first DRC is configured to manipulate dynamic range by expansion.

14. A method for processing signals communicated from an audio source, the signals communicated from the audio source include a left channel audio signal and a right channel audio source, both of which being processable to produce at least one input combination signal, the method comprising:
a signal processing step which includes a first channel processing step at which the at least one input combination signal is received and processed at a first channel processing portion, processing the at least one input combination signal at the first channel processing portion includes:
extracting, via an extraction step, bass frequency audio signals from the at least one input combination signal;
processing, via a dynamic range processing step, the bass frequency audio signals via at least one of linear dynamic range processing, manipulation of dynamic range via compression and manipulation of dynamic range via expansion to produce processed bass frequency audio signals;
processing, via a splitting step, the processed bass frequency audio signals to produce a first bass portion and a second bass portion;
processing, via an adjustment step, the second bass portion to produce a processed second bass portion; and
processing, via a combining step, the first bass portion and the processed second bass portion to produce a first channel signal.

15. The method of claim 14 wherein the signal processing step further includes a second channel processing step at which the at least one input combination signal is further received and processed by a second channel processing portion, and
wherein processing of the at least one input combination signal by the second channel processing portion includes manipulation of dynamic range, via a dynamic range manipulation step, by expansion corresponding to an expansion ratio, thereby producing a second channel signal.

16. The method of claim 15 wherein the expansion ratio is 1.2:1.

17. The method of claim 14 wherein the second bass portion includes a fundamental bass frequency signal and processing the second bass portion to produce a processed second bass portion includes:
processing, via a harmonic generator, the second bass portion in a manner such that harmonics of the fundamental bass frequency signal are generated, the generated harmonics including high order harmonics and low order harmonics;
processing the generated harmonics, via a filter, such that communication of high order harmonics is impeded; and processing the low order harmonics, via a shifter, in a manner such that there is an offset between the harmonics of the fundamental bass frequency signal and bass frequency audio signals associated with the first bass portion.

18. The method of claim 17 wherein processing the low order harmonics via the shifter includes time shifting the low order harmonics such that there is a time delay between the harmonics of the fundamental bass frequency signal and bass frequency audio signals associated with the first bass portion.

19. The method of claim 14 wherein processing the bass frequency audio signals via the first DRC includes at least one of:
 linear dynamic range processing corresponding to a linear ratio of 1:1;
 manipulation of dynamic range via compression corresponding to a compression ratio between 1.2:1 and 2:1; and
 manipulation of dynamic range via expansion corresponding to an expansion ratio of 1.2:1.

20. A processing apparatus suitable for signal communication with a system having at least one of an input module and an output module, the processing apparatus being configurable to receive input signals from the input module of the system, the processing apparatus comprising:
 a first channel processing portion to which the input signals are communicable, the first channel processing portion being configurable to receive and process the input signals, the input signals being processed in a manner such that bass frequency audio signals are extracted from the input signals, the bass frequency audio signals being further processed via at least one of linear dynamic range processing, manipulation of dynamic range via compression and manipulation of dynamic range via expansion, the first channel processing portion comprising:
  a low frequency processing portion which includes:
   a first dynamic range compressor (DRC) which receives and processes the bass frequency audio signals via at least one of linear dynamic range processing, manipulation of dynamic range via compression and manipulation of dynamic range via expansion to produce processed bass frequency audio signals;
   a splitter which is coupled to the first DRC and which receives and further processes the processed bass frequency audio signals to produce a first bass portion and a second bass portion; and
   a low frequency adjustment module which is coupled to the splitter and which receives and processes the second bass portion to produce a processed second bass portion, and
  a sub-channel combiner module coupled to the splitter and the low frequency adjustment module, the sub-channel combiner module receiving and processing the first bass portion and the processed second bass portion to produce a first channel signal, and
 a second channel processing portion to which the input signals are communicable, the second channel processing portion being configurable to receive and process the input signals via manipulation of dynamic range by expansion corresponding to an expansion ratio, thereby producing a second channel signal,
 wherein the first and second channel signals are communicable to the output module.

* * * * *